US012779724B2

(12) United States Patent
Dick et al.

(10) Patent No.: US 12,779,724 B2
(45) Date of Patent: Nov. 3, 2026

(54) GLASS REMOVAL TOOL

(71) Applicant: Milwaukee Electric Tool Corporation, Brookfield, WI (US)

(72) Inventors: Ryan C. Dick, Sussex, WI (US); Benjamin J. Paprocki, Cottage Grove, WI (US); Christian R. Braun, Milwaukee, WI (US); Benjamin T. Jones, St. Francis, WI (US); Aaron M. Williams, Milwaukee, WI (US); Aaron S. Blumenthal, Shorewood, WI (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 789 days.

(21) Appl. No.: 18/055,049

(22) Filed: Nov. 14, 2022

(65) Prior Publication Data

US 2023/0150161 A1 May 18, 2023

Related U.S. Application Data

(60) Provisional application No. 63/279,517, filed on Nov. 15, 2021.

(51) Int. Cl.
*B26D 7/18* (2006.01)
*B26D 1/547* (2006.01)
(Continued)

(52) U.S. Cl.
CPC ............... *B26D 7/18* (2013.01); *B26D 1/547* (2013.01); *B21F 1/02* (2013.01); *B25B 11/007* (2013.01);
(Continued)

(58) Field of Classification Search
CPC .......... B26D 7/18; B26D 1/547; B26D 1/508; B26D 1/574; B26D 7/018; B21F 1/02;
(Continued)

(56) References Cited

U.S. PATENT DOCUMENTS

| | | | |
|---|---|---|---|
| 1,862,976 | A | 6/1932 | Merneck |
| 2,014,535 | A | 9/1935 | Maca |
| 2,241,028 | A | 5/1941 | Chubb |
| 2,275,732 | A | 3/1942 | Chubb |

(Continued)

FOREIGN PATENT DOCUMENTS

| | | |
|---|---|---|
| WO | WO8607017 | 12/1986 |
| WO | WO9813238 | 4/1998 |

(Continued)

OTHER PUBLICATIONS

Carglass Portugal YouTube Chanel, Replacement with Ezi Wire Video, https://www.youtube.com/watch?v=-WJvPMXOIXk, Feb. 18, 2016, 3 pages.

(Continued)

*Primary Examiner* — Ghassem Alie
(74) *Attorney, Agent, or Firm* — Reinhart Boemer Van Deuren s.c.

(57) ABSTRACT

A system for removing glass sealed to an object such as an automobile is shown. The glass removal system includes a cord and wire glass removal tool and a remote control device. The cord and wire glass removal tool includes a body, a motor, a vacuum pump, an attachment mechanism and a power source. The cord and wire glass removal tool can be paired with a remote control device allowing a user to place the tool on an inner surface of the glass and operate the tool from a position adjacent to the outside surface of the glass.

12 Claims, 24 Drawing Sheets

(51) Int. Cl.

| | |
|---|---|
| *B21F 1/02* | (2006.01) |
| *B25B 11/00* | (2006.01) |
| *B26B 27/00* | (2006.01) |
| *B60J 1/00* | (2006.01) |
| *B60J 1/02* | (2006.01) |
| *H10P 72/78* | (2026.01) |

(52) U.S. Cl.
CPC ............... *B26B 27/002* (2013.01); *B60J 1/00* (2013.01); *B60J 1/02* (2013.01); *H10P 72/78* (2026.01)

(58) Field of Classification Search
CPC ........ B25B 11/007; B26B 27/002; B60J 1/00; B60J 1/02; H01L 21/6838; B65G 49/061; B65G 2249/045; H10P 72/78
USPC .......................................................... 83/651.1
See application file for complete search history.

(56) References Cited

U.S. PATENT DOCUMENTS

| | | | |
|---|---|---|---|
| 2,305,995 | A | 12/1942 | Roberts |
| 3,448,517 | A | 6/1969 | Cothery |
| 3,620,524 | A | 11/1971 | Czompi |
| 3,807,791 | A | 4/1974 | Boyer |
| 4,080,734 | A | 3/1978 | Barbour |
| 4,199,852 | A | 4/1980 | Ayers et al. |
| 4,395,825 | A | 8/1983 | Lock |
| 4,417,398 | A | 11/1983 | Steck |
| 4,457,503 | A | 7/1984 | Connor |
| 4,481,059 | A | 11/1984 | Steck |
| 4,789,417 | A | 12/1988 | Komatsu |
| 4,852,237 | A | 8/1989 | Tradt et al. |
| 4,875,955 | A | 10/1989 | Fujii |
| 4,876,132 | A | 10/1989 | Kunert |
| 4,934,854 | A | 6/1990 | Vesely |
| 4,995,153 | A | 2/1991 | Asbery |
| 4,998,711 | A | 3/1991 | Borg |
| 5,085,415 | A | 2/1992 | Shaver |
| 5,123,315 | A | 6/1992 | Asbery |
| 5,190,604 | A | 3/1993 | Shaver |
| 5,309,805 | A | 5/1994 | Mezger et al. |
| 5,467,525 | A | 11/1995 | Pine et al. |
| 5,479,689 | A | 1/1996 | Schmit |
| 5,593,145 | A | 1/1997 | Sprayberry |
| 5,622,093 | A | 4/1997 | Hutchins |
| 5,639,134 | A | 6/1997 | Rusch et al. |
| 5,695,236 | A | 12/1997 | Banno |
| 5,772,823 | A | 6/1998 | Rusch |
| 5,778,517 | A | 7/1998 | Amesbichler et al. |
| 5,820,116 | A | 10/1998 | Haese |
| 5,820,119 | A | 10/1998 | Chacon, Sr. |
| 5,953,802 | A | 9/1999 | Radzio |
| 6,035,510 | A | 3/2000 | Amesbichler et al. |
| 6,042,670 | A | 3/2000 | Kuribayashi et al. |
| 6,099,063 | A | 8/2000 | Rohagti |
| 6,101,702 | A | 8/2000 | Claycomb et al. |
| 6,152,203 | A | 11/2000 | Maeda |
| 6,178,645 | B1 | 1/2001 | Lock |
| 6,230,077 | B1 | 5/2001 | Choi |
| 6,245,173 | B1 | 6/2001 | Kuribayashi |
| 6,364,404 | B1 | 4/2002 | Paoli |
| 6,447,638 | B1 | 9/2002 | Maeda |
| 6,460,917 | B2 | 10/2002 | Paoli |
| 6,481,078 | B1 | 11/2002 | Stone |
| 6,543,117 | B1 | 4/2003 | Claycomb et al. |
| 6,578,248 | B1 | 6/2003 | Boldizar |
| 6,591,502 | B1 | 7/2003 | Gmeilbauer |
| 6,606,778 | B1 | 8/2003 | Krass et al. |
| 6,616,800 | B2 | 9/2003 | Eriksson |
| 6,824,281 | B2 | 11/2004 | Schofield et al. |
| 7,039,995 | B2 | 5/2006 | Thompson |
| 7,044,412 | B2 | 5/2006 | Hemond et al. |
| 7,188,399 | B2 | 3/2007 | Campus et al. |
| 7,188,963 | B2 | 3/2007 | Schofield et al. |
| 7,216,411 | B1 | 5/2007 | Mayhugh |
| 7,322,092 | B2 | 1/2008 | Adas et al. |
| 7,533,998 | B2 | 5/2009 | Schofield et al. |
| 7,587,802 | B2 | 9/2009 | Tsuchiya |
| 7,610,666 | B2 | 11/2009 | Adas et al. |
| 7,823,833 | B2 | 11/2010 | Wood |
| 7,976,094 | B2 | 7/2011 | Lesle |
| 7,992,908 | B2 | 8/2011 | Finck |
| 8,087,615 | B2 | 1/2012 | Wood |
| 8,099,869 | B2 | 1/2012 | Hess |
| 8,104,809 | B1 | 1/2012 | Mayhugh |
| 8,117,731 | B2 | 2/2012 | Miwa et al. |
| 8,179,437 | B2 | 5/2012 | Schofield et al. |
| 8,307,873 | B2 | 11/2012 | Klabunde et al. |
| 8,393,064 | B2 | 3/2013 | Adas et al. |
| 8,405,726 | B2 | 3/2013 | Schofield et al. |
| 8,429,865 | B2 | 4/2013 | Nania |
| 8,444,193 | B2 | 5/2013 | Fink |
| 8,474,355 | B2 | 7/2013 | Fink |
| 8,508,593 | B1 | 8/2013 | Schofield et al. |
| 8,572,835 | B2 | 11/2013 | Skluzak et al. |
| 8,650,733 | B2 | 2/2014 | Daigle, Sr. et al. |
| 8,672,309 | B2 | 3/2014 | Birkhauser et al. |
| 8,677,626 | B2 | 3/2014 | Adas et al. |
| 8,701,735 | B2 | 4/2014 | Klabunde et al. |
| 8,720,967 | B2 | 5/2014 | Willey |
| 8,733,747 | B2 | 5/2014 | Glikis |
| 8,749,633 | B2 | 6/2014 | Schofield et al. |
| 8,776,652 | B2 | 7/2014 | Clabunde |
| 8,832,918 | B2 | 9/2014 | Ali |
| 8,904,711 | B2 | 12/2014 | Revilla et al. |
| 9,016,182 | B2 | 4/2015 | Seebauer |
| 9,079,715 | B2 | 7/2015 | Finck |
| 9,112,278 | B2 | 8/2015 | Shi |
| 9,216,635 | B2 | 12/2015 | Medina |
| 9,233,478 | B2 | 1/2016 | Finck |
| 9,248,992 | B2 | 2/2016 | Davies et al. |
| 9,643,475 | B2 | 5/2017 | Finck et al. |
| 9,701,486 | B2 | 7/2017 | Finck |
| 9,701,509 | B2 | 7/2017 | Davies et al. |
| 9,840,016 | B2 | 12/2017 | Finck |
| 9,862,323 | B2 | 1/2018 | Schofield et al. |
| 9,862,563 | B2 | 1/2018 | Finck |
| 9,962,847 | B2 | 5/2018 | Carlton et al. |
| 10,196,006 | B1 | 2/2019 | Warren |
| 10,214,257 | B1 | 2/2019 | Viola |
| 10,227,965 | B2 | 3/2019 | Mayhugh |
| 10,254,088 | B1 | 4/2019 | Luster |
| 10,286,525 | B2 | 5/2019 | Finck |
| 10,543,786 | B2 | 1/2020 | Schofield et al. |
| 10,569,437 | B2 | 2/2020 | Finck |
| 10,695,926 | B2 | 6/2020 | Rodger |
| 10,710,656 | B2 | 7/2020 | Paz et al. |
| 10,843,532 | B2 | 11/2020 | Weakland |
| 10,913,354 | B2 | 2/2021 | Warren |
| 11,014,217 | B2 | 5/2021 | Finck et al. |
| 2001/0050456 | A1 | 12/2001 | Wallis |
| 2002/0112333 | A1 | 8/2002 | Wallis |
| 2003/0093960 | A1 | 5/2003 | Mizusawa et al. |
| 2004/0139662 | A1 | 7/2004 | Mizusawa et al. |
| 2004/0221950 | A1 | 11/2004 | Mizusawa et al. |
| 2005/0076572 | A1 | 4/2005 | Cardine et al. |
| 2006/0156533 | A1 | 7/2006 | Mayhugh |
| 2007/0062020 | A1 | 3/2007 | Mayhugh |
| 2007/0119033 | A1 | 5/2007 | Gray et al. |
| 2008/0012349 | A1 | 1/2008 | Finck |
| 2008/0012383 | A1 | 1/2008 | Larson |
| 2008/0017295 | A1* | 1/2008 | Finck ......................... B60J 1/02 156/108 |
| 2008/0201963 | A1 | 8/2008 | Davies et al. |
| 2009/0066108 | A1 | 3/2009 | Deland et al. |
| 2009/0091071 | A1 | 4/2009 | Finck |
| 2009/0283214 | A1* | 11/2009 | Nelson ..................... B26D 5/08 264/173.11 |
| 2009/0300847 | A1 | 12/2009 | Chan |
| 2010/0132882 | A1 | 6/2010 | Hess et al. |
| 2011/0029332 | A1 | 2/2011 | Hugron et al. |

(56) References Cited

U.S. PATENT DOCUMENTS

| | | | | |
|---|---|---|---|---|
| 2012/0227896 | A1* | 9/2012 | Clabunde | B26D 1/547 156/193 |
| 2013/0283986 | A1 | 10/2013 | Finck | |
| 2015/0360737 | A1 | 12/2015 | Brummett et al. | |
| 2016/0281700 | A1* | 9/2016 | Mayhugh | F04B 37/14 |
| 2017/0100849 | A1 | 4/2017 | Finck | |
| 2017/0232582 | A1 | 8/2017 | Finck et al. | |
| 2017/0341490 | A1 | 11/2017 | Milosavljevic | |
| 2017/0355408 | A1 | 12/2017 | Levy | |
| 2018/0243890 | A1 | 8/2018 | Hudlin et al. | |
| 2019/0054805 | A1* | 2/2019 | Weakland | B66C 23/022 |
| 2019/0232761 | A1 | 8/2019 | Foss et al. | |
| 2020/0086518 | A1 | 3/2020 | Boehmer et al. | |
| 2020/0198165 | A1 | 6/2020 | Hauser et al. | |
| 2020/0338774 | A1 | 10/2020 | Finck | |
| 2021/0122062 | A1 | 4/2021 | Kllibarda et al. | |

FOREIGN PATENT DOCUMENTS

| | | |
|---|---|---|
| WO | WO9824649 | 6/1998 |
| WO | WO0051834 | 9/2000 |
| WO | WO0220335 | 3/2002 |
| WO | WO03101671 | 12/2003 |
| WO | WO06030212 | 3/2006 |
| WO | WO09126019 | 10/2009 |
| WO | WO10100525 | 9/2010 |
| WO | WO11101668 | 8/2011 |
| WO | WO12072899 | 6/2012 |
| WO | WO12121631 | 9/2012 |
| WO | WO14071192 | 5/2014 |
| WO | WO16089286 | 6/2016 |
| WO | WO16101018 | 6/2016 |
| WO | WO19200165 | 10/2019 |
| WO | WO20079600 | 4/2020 |

OTHER PUBLICATIONS

Carglass Greece YouTube Chanel, 1 Tek Video, https://www.youtube.com/watch?v=wtQxLUJd8-M, Apr. 21, 2015, 3 pages.

Hunter Learning YouTube Chanel, Hunter asTech ADAS Assist—Dynamic Calibration video, https://www.youtube.com/watch?v=-e41fJo1811g, Nov. 4, 2020, 3 pages.

* cited by examiner

GLASS REMOVAL TOOL

CROSS-REFERENCE TO RELATED PATENT APPLICATION

The present application claims the benefit of and priority to U.S. Provisional Application No. 63/279,517 filed on Nov. 15, 2021, which is incorporated herein by reference in its entirety.

BACKGROUND OF THE INVENTION

The present invention relates generally to the field of tools. The present invention relates specifically to a tool for removing glass sealed to another object such as an automobile.

SUMMARY OF THE INVENTION

One embodiment of the invention relates to glass removal system including a glass removal tool. The glass removal tool includes a body, a motor coupled to the body, and an axle supported by the body. A spool is rotatably mounted to the axle and a cutting medium is wound around the spool. The cutting medium is configured to cut through a sealant extending around and holding a piece of glass in place. The glass removal tool further includes a transmission system coupled to and extending between the motor and the axle, a vacuum pump, an attachment mechanism, and a power source. The vacuum pump is coupled to the body and creates a vacuum force to couple the attachment mechanism to an inner surface of the piece of glass. The power source is electrically coupled to the motor and vacuum pump. The glass removal system further includes a remote control device configured to control the motor from a distance away from the glass removal tool. The cutting medium is threaded through a gap in the sealant and extended around an outer surface of the piece of glass. When the motor drives retraction of the cutting medium onto the spool, a cutting force is created allowing the cutting medium to cut through the sealant.

Another embodiment of the invention relates to glass removal tool including a body, a motor, a spool, a vacuum pump, a transmission system, and an attachment mechanism. The attachment mechanism is coupled to a surface of a piece of glass. The vacuum pump creates a force to couple the attachment mechanism of the glass removal tool to the piece of glass. A shaft of the motor is coupled to the transmission system. The transmission system is coupled to an axle that is rotatably coupled to the spool. The spool includes a cutting medium wound around the spool. The cutting medium is configured to cut through a sealant holding the piece of glass in place.

Another embodiment of the invention relates to remote control device configured to control the motor of the glass removal tool from a distance away from the glass removal tool. In such embodiments, the glass removal tool includes a communication device configured to receive wireless signals from the remote control device. The remote control device includes a power button and a button or trigger that generates a command signal that acts to start the motor when received by the communication device of the glass removal tool. When an operator presses a torque control button the power of the motor can be increased.

Additional features and advantages will be set forth in the detailed description which follows, and, in part, will be readily apparent to those skilled in the art from the description or recognized by practicing the embodiments as described in the written description and claims hereof, as well as the appended drawings. It is to be understood that both the foregoing general description and the following detailed description are exemplary.

The accompanying drawings are included to provide further understanding and are incorporated in and constitute a part of this specification. The drawings illustrate one or more embodiments and, together with the description, serve to explain principles and operation of the various embodiments.

BRIEF DESCRIPTION OF THE DRAWINGS

This application will become more fully understood from the following detailed description, taken in conjunction with the accompanying figures, wherein like reference numerals refer to like elements in which.

DETAILED DESCRIPTION

Referring generally to the figures, various embodiments of a system for removing glass (e.g., a windshield) sealed to another object such as an automobile are shown. Various embodiments of the system for removing glass discussed herein allow for a single individual to remove sealant and/or adhesive (e.g., urethane) that holds the glass to the body of the automobile. As discussed herein, Applicant has developed a number of improvements to the functionality of the glass removal system. In contrast to the glass removal system discussed herein, many glass removal systems require multiple people working together to operate the glass removal tool and then to remove the windshield from its position on the body of the automobile. Applicant believes the remote control device discussed herein allows a single person to complete the glass removal process that often requires more than one person due to the unwieldy nature of a windshield. Once the removal tool has been placed on the windshield, a single user can operate the remote control device from a position outside of the automobile allowing for the user to grasp and separate the windshield from the automobile. The glass removal system may also include an arm (e.g., a boom arm) configured to grasp the windshield to further assist the user and improve the ease of removal of the windshield.

Further, Applicant believes the glass removal tool and remote control device described allow a single user to more quickly place the removal tool, remove the sealant between the glass and remove the windshield. Many glass removal tools require a user to operate the tool from inside the automobile. As will be discussed in greater detail, a user is able to use the remote control device from outside of the automobile to communicate with the removal tool that has already been placed on the inside of the windshield. Therefore, a user can more efficiently complete a project like a windshield replacement by themselves (i.e., less movement in and out of automobile is required).

Figure 1:
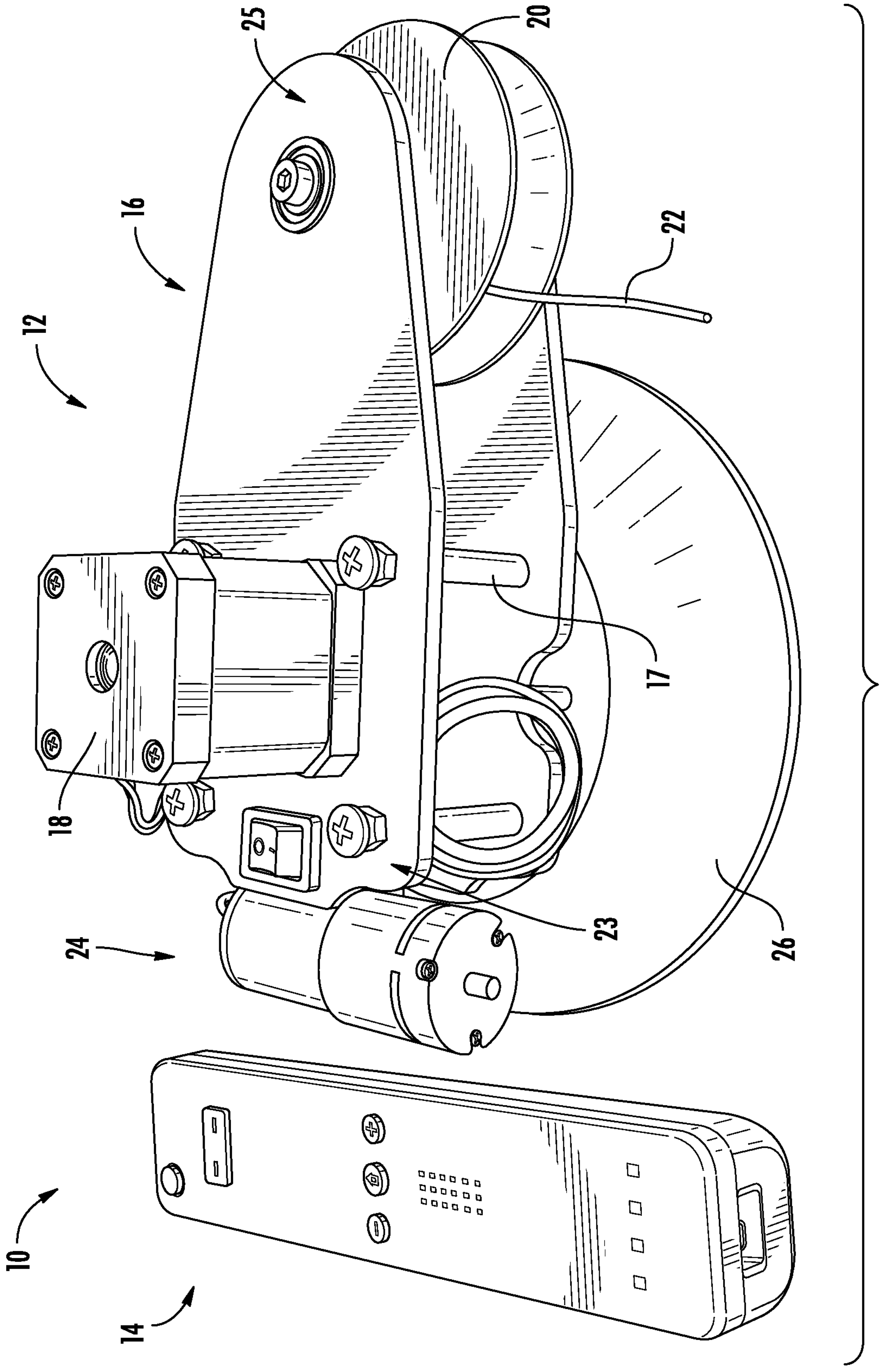
FIG. 1 is a perspective view of a glass removal system including a cord and wire glass removal tool and a remote control, according to an exemplary embodiment.

Referring to FIG. 1, various aspects of a system for removing sealed glass, shown as glass removal system 10 are shown. Glass removal system 10 includes a tool, shown as a cord and wire glass removal tool 12 and a remote control device, shown as a remote control 14. Cord and wire glass removal tool 12 includes a body 16, a motor 18, a spool 20, a vacuum pump 24, and an attachment mechanism, a portion of the attachment mechanism is shown as a suction cup 26. Motor 18 is coupled to body 16 of cord and wire glass removal tool 12. In a specific embodiment, motor 18 is a stepper motor. In another specific embodiment, motor 18 is a direct current (DC) motor.

Vacuum pump 24 is coupled a first end 23 of body 16. The first end 23 of body 16 is adjacent to motor 18. A second end 25 opposes first end 23 of body 16. Suction cup 26 is coupled to body 16 at first end 23 and positioned below motor 18 and adjacent to vacuum pump 24. Spool 20 is positioned within body 16 at second end 25. A cutting medium or wire 22 is wound or coiled onto spool 20.

Figure 2:
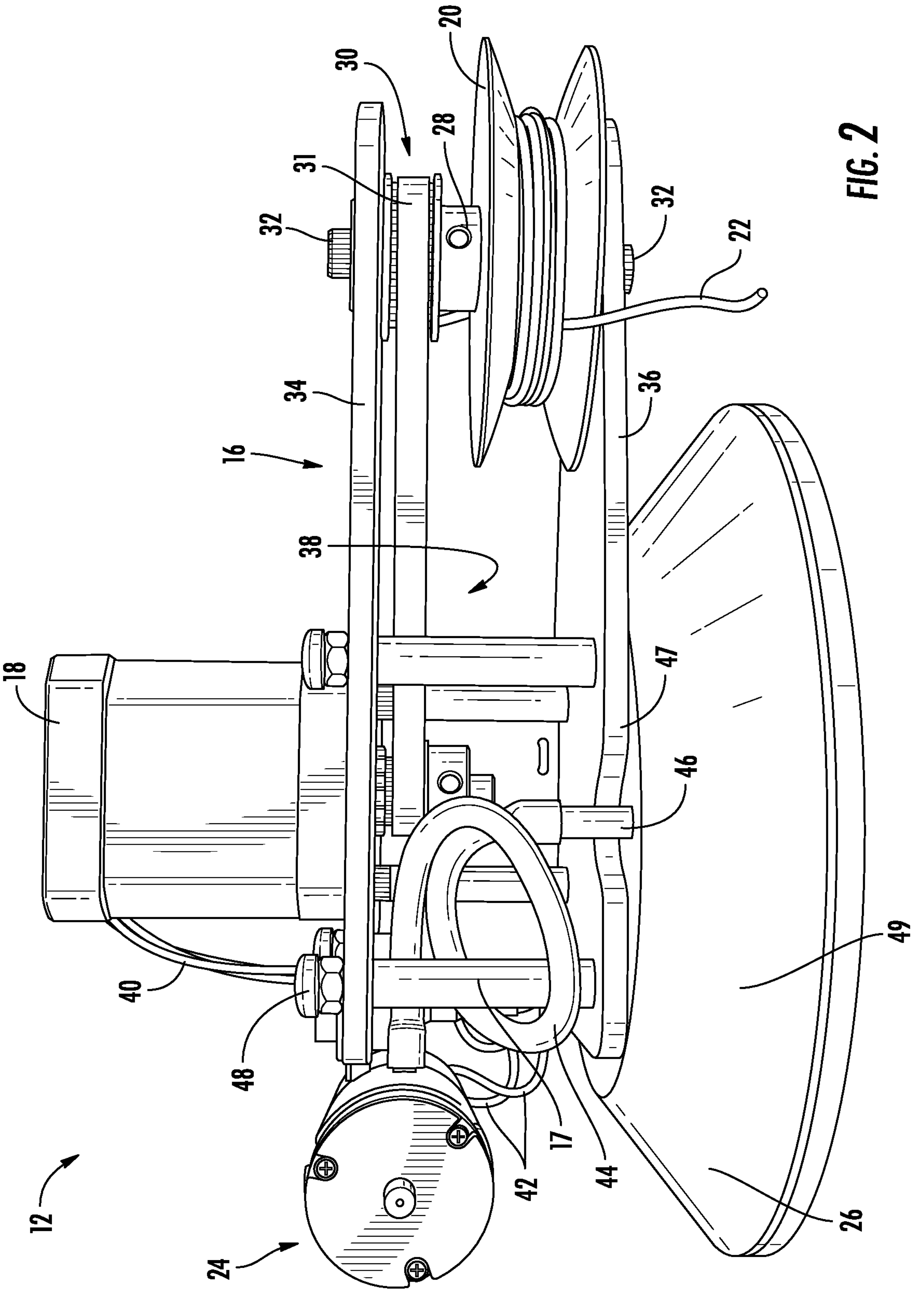
FIG. 2 is a front perspective view of the cord and wire glass removal tool of FIG. 1, according to an exemplary embodiment.

Referring to FIGS. 1-2, various aspects of cord and wire glass removal tool 12 are shown. Body 16 further includes a plurality of connectors or legs 17 that extend between an upper portion 34 and a lower portion 36. Each of the plurality of legs 17 receives a fastener 48 (e.g., screws, bolts etc.) to couple legs 17, upper portion 34 and lower portion 36 of body 16 together. A space or gap 38 is defined between upper portion 34 and lower portion 36 of body 16. Spool 20 is rotatably mounted to a shaft or axle 28 that extends between and is supported by upper portion 34 and lower portion 36. In a specific embodiment, axle 28 is rotatably coupled to upper portion 34 and lower portion 36 such that axle 28 is allowed to rotate relative to body 16 during extension or retraction of cutting medium 22. In a specific embodiment, axle 28 is coupled to upper portion 34 and lower portion 36 by one or more fasteners, shown as screws 32.

A transmission system 30 is positioned within gap 38 between upper portion 34 and lower portion 36 of body 16. Transmission system 30 includes a transmission belt 31. Transmission system 30 is coupled to a shaft of motor 18 that extends downward to a position below upper portion 34. Transmission belt 31 and transmission system 30 extend from below motor 18 at first end 23 of body 16 to above spool 20 at second end 25 of body 16. Motor 18 is connected or electrically coupled by a plurality of motor wires 40 to a power source, shown as a battery 52 (see e.g., FIG. 3). Vacuum pump 24 is connected by vacuum pump wires 42 to a power source, shown as battery 52 (see e.g., FIG. 3).

Vacuum pump 24 is connected to a flexible hose or tube 44 at a first end 43 of the tube 44. Tube 44 is another portion of the attachment mechanism and includes a second end 45 that opposes first end 43. Second end 45 of tube 44 is connected to a suction cup insert 46 configured to be received within second end 45 of tube 44. Suction cup 26 further includes a generally horizontal, upward facing portion 47 and an angled portion 49 that extends downward, away from upward facing portion 47 and body 16. Suction cup insert 46 is positioned on upward facing portion 47 of suction cup 26 and extends generally upward away from generally horizontal, upward facing portion 47 of suction cup 26 toward upper portion 34 of body 16.

Suction cup 26 is designed to be placed on a surface of a nonporous material such as glass and specifically a windshield (e.g., inward facing or outward facing surface). In other words, an interior surface of suction cup 26 faces and is attached to the inner surface of windshield 84 and tube 44 is coupled to and extends between vacuum pump 24 and suction cup 26. In a specific embodiment, one large suction cup 26 is used to attach cord and wire glass removal tool 12 to the windshield. In another embodiment, a plurality of suction cups 26 may be used to attach cord and wire glass removal tool 12 to a windshield. In a specific embodiment, suction cup 26 is formed from a polymer material (e.g., rubber, polyvinyl chloride (PVC), acrylonitrile butadiene styrene (ABS), etc.).

When a user places cord and wire glass removal tool 12 on a surface (e.g., a windshield) the interior surface of suction cup 26 faces and attaches to the interior surface of the windshield. In a specific embodiment, the interior surface of suction cup 26 is a concave surface. When vacuum pump 24 is turned on, the air within suction cup 26 is evacuated creating a pressure differential between a space inside suction cup 26 and the outside environment (i.e., outside of suction cup 26) or atmosphere such that suction cup 26 is attached to the glass or windshield 84. The outside pressure is greater than an internal pressure of suction cup 26, pushes suction cup 26 and cord and wire glass removal tool 12 toward the windshield and creates a vacuum force. The vacuum force generated by the vacuum pump 24 is greater than the cutting force generated by cord are wire glass removal tool 12 cutting the sealant that was holding the windshield in place.

Figure 3:
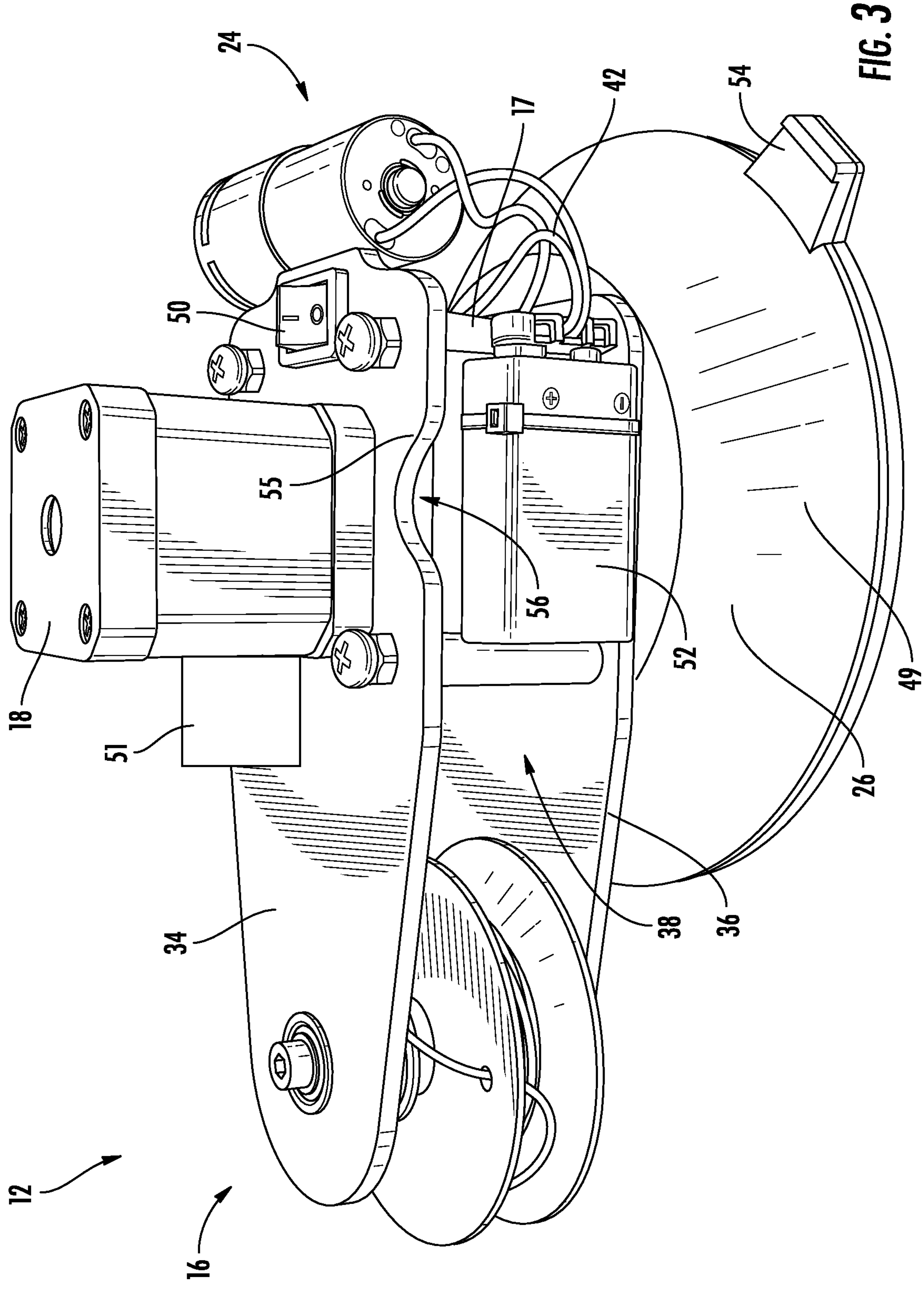
FIG. 3 is a rear perspective view of the cord and wire glass removal tool of FIG. 1, according to an exemplary embodiment.

Referring to FIG. 3, a rear perspective view of the cord and wire glass removal tool 12 is shown. The power source, shown as battery 52 is positioned at least partially within gap 38, between upper portion 34 and lower portion 36 of body 16. More specifically, battery 52 is positioned between at least two of legs 17 of body 16. The use of and positioning of the power source of cord and wire glass removal tool 12 allows for a compact design and easy portability for the user. In a specific embodiment, cord and wire glass removal tool 12 is powered by a 9-volt battery 52. In other embodiments, battery 52 is a rechargeable power tool battery, such as a lithium-ion power tool battery.

Body 16, and specifically upper portion 34 includes a curved section 55. Curved section 55 extends inward toward motor 18 and defines a recess 56. Recess 56 allows access to transmission system 30 such that transmission belt 31 (see e.g., FIG. 2) can be tensioned after installation. Upper portion 34 further includes a toggle or switch 50 to permit a user to turn cord and wire glass removal tool 12 (i.e., motor 18 and vacuum pump 24) on and off. In one embodiment, a communication device 51, shown schematically is coupled to body 16 and/or motor 18 and configured to receive signals, such as wireless signals from the remote control device 14. In another embodiment, communication device 51 may be integral with motor 18.

Suction cup 26 further includes a tab 54 coupled to and extending away from angled portion 49. Tab 54 assists a user in releasing suction cup 26 from the windshield once the vacuum pump has been turned off and cord and wire glass removal tool 12 is ready to be removed from the windshield.

Figure 4:
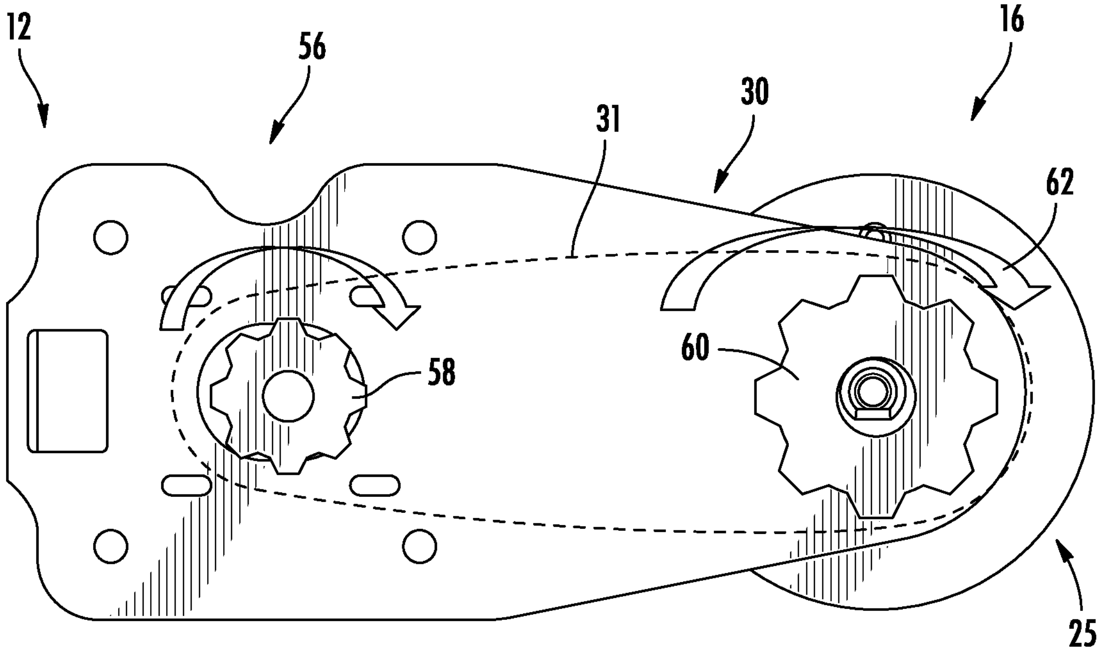
FIG. 4 is a detailed plan view of a transmission system of the cord and wire glass removal tool of FIG. 1, according to an exemplary embodiment.

Referring to FIG. 4, detailed plan view of the transmission system 30 is shown, according to an exemplary embodiment. Transmission system 30 includes a first gear 58 coupled to motor 18, a second gear 60 positioned at second end 25 of body 16 and transmission belt 31. Transmission belt 31 connects first gear 58 and second gear 60 transmitting power from motor 18 to axle 28 and cutting medium 22. First gear 58 is coupled to and rotatable about a shaft of motor 18. Second gear 60 is coupled to axle 28.

In a specific embodiment, first gear 58 is a pinion gear with a smaller diameter than second gear 60. The gear ratio is designed such that motor 18 provides a torque large enough to cut through the sealant surrounding the windshield. In a specific embodiment, first gear 58 and second gear 60 rotate in a clockwise direction, shown by arrow 62 during cutting of the sealant. In another embodiment, first gear 58 and second gear 60 may be rotated in a counterclockwise direction during cutting of the sealant.

As discussed above, Applicant believes the use of a remote control device with cord and wire glass removal tool 12 allows a single user to more easily remove the sealant between glass and automobile such that the glass and/or windshield can be removed without requiring an additional person. Further, glass removal system 10 allows the user to place cord and wire glass removal tool 12 on the inside of the windshield and then operate the glass removal tool 12 from outside of the automobile, allowing a user to more efficiently complete a project like a windshield replacement.

Figure 5:
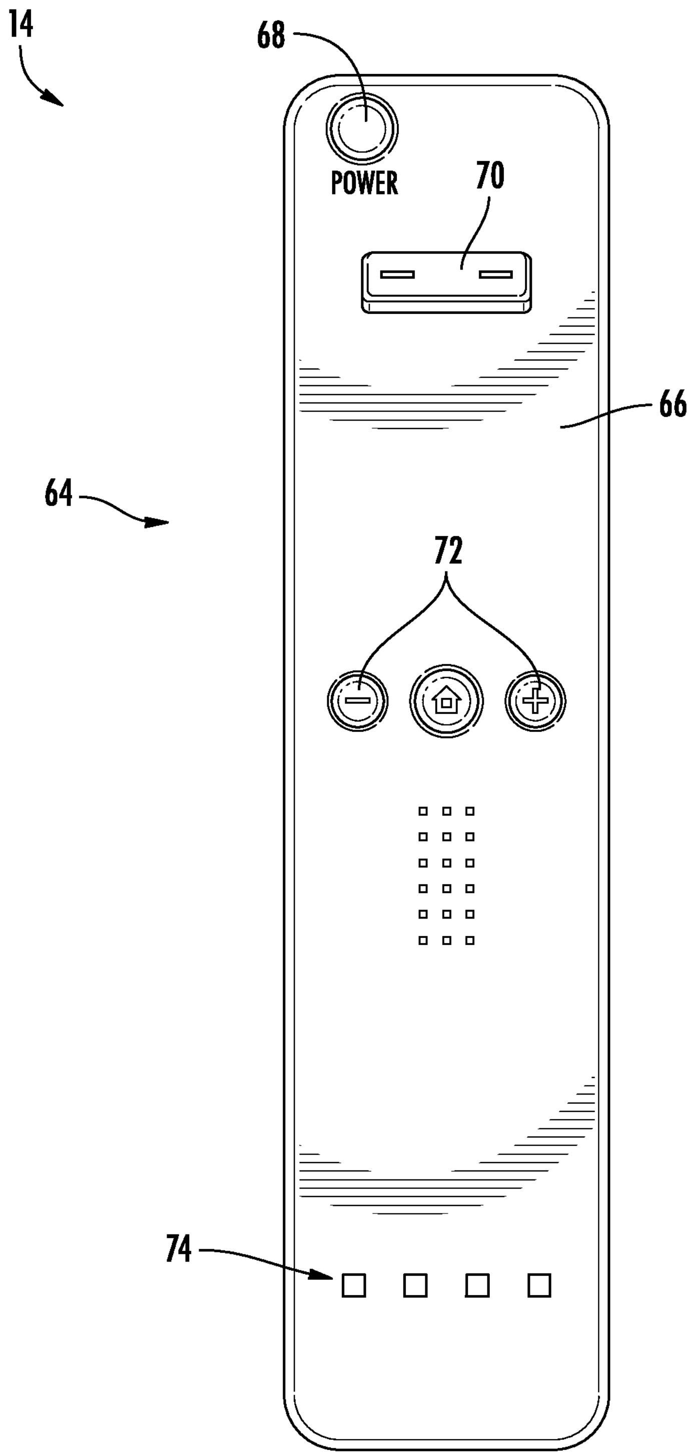
FIG. 5 is a perspective view of the remote control of FIG. 1, according to an exemplary embodiment.
Figure 6:
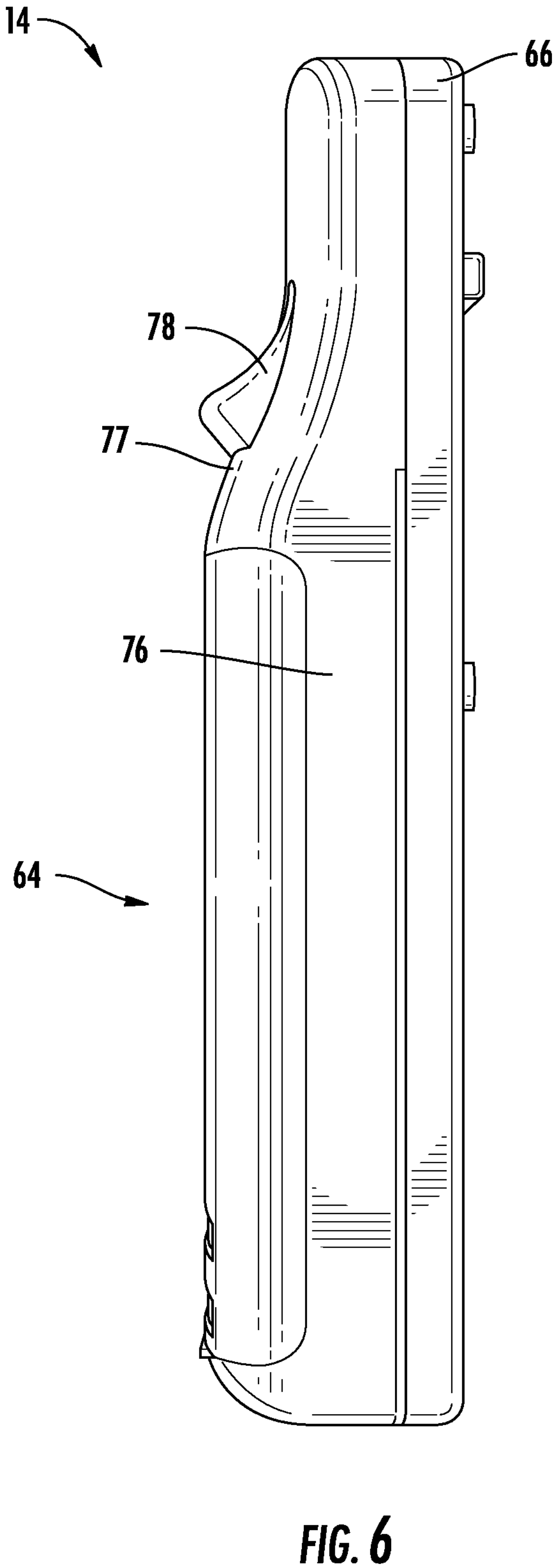
FIG. 6 is a left-side perspective view of the remote control of FIG. 5, according to an exemplary embodiment.

Referring to FIGS. 5-6, perspective views of a remote control device, shown as remote control 14 are shown. Remote control 14 is configured to interact with cord and wire glass removal tool 12 from a distance. For example, a user selects a command on remote control 14, and in response remote control 14 emits a command signal to be received by communication device 51 of cord and wire glass removal tool 12 providing a command to cord and wire glass removal tool 12 (e.g., start motor, increase or decrease motor power, etc.). In a specific embodiment, a trigger (e.g., 78) on the remote control 14 generates a command signal to start the motor 18 or adjust a power level to the motor 18 when received by the communication device 51 of the glass removal tool 12. In a specific embodiment, remote control 14 uses a wireless local area network (WLAN) shown as Wi-Fi 88 (see e.g., FIG. 7) to communicate with communication device 51 of cord and wire glass removal tool 12. In other embodiments, the remote control 14 may use radiofrequency (RF), Bluetooth, or infrared communication.

Remote control 14 includes an upper housing portion 66 and a lower housing portion 76 that can be fastened together to form remote housing 64. In some embodiments, remote housing 64 is a single, continuous, and/or integral part such that upper housing portion 66 and lower housing portion 76 are permanently joined and/or fabricated as a unitary part. Remote control 14 includes one or more physical interfacing components, shown as buttons (see e.g., 68, 70, 72 etc.). A power button 68 is positioned on upper housing portion 66 allowing a user to turn remote control 14 on and off. Upper housing portion 66 further includes a direction control button 70. Direction control button 70 allows a user to change the direction of motor 18. For example, if the motor was rotating in a counterclockwise direction and the user pressed the right portion of direction control button 70, motor 18 would brake, before beginning to rotate in a clockwise direction.

Remote control 14 further includes a pair of torque control buttons 72. Torque control buttons 72 allow a user to increase or decrease the motor power as necessary during the cutting process. For example, if the user pushes the right torque control button 72, the power to motor 18 of cord and wire glass removal tool 12 is increased and if the user pushes the left torque control button 72, the power to motor 18 is decreased. Upper housing portion 66 further includes a torque level indicator, shown as display 74. Display 74 gives a visual indication to a user of the current power level of cord and wire glass removal tool 12. For example, as the power level of cord and wire glass removal tool 12 increases, the number of lights emitting a signal on display 74 will also increase. Lower housing portion 76 includes a curved portion 77 configured to receive a portion of the user's hand (i.e., fingers) as remote control 14 is held. A trigger 78 is positioned within curved portion 77 of lower housing portion 76. When remote control 14 is powered on and the user presses trigger 78, motor 18 is started.

Figure 7:
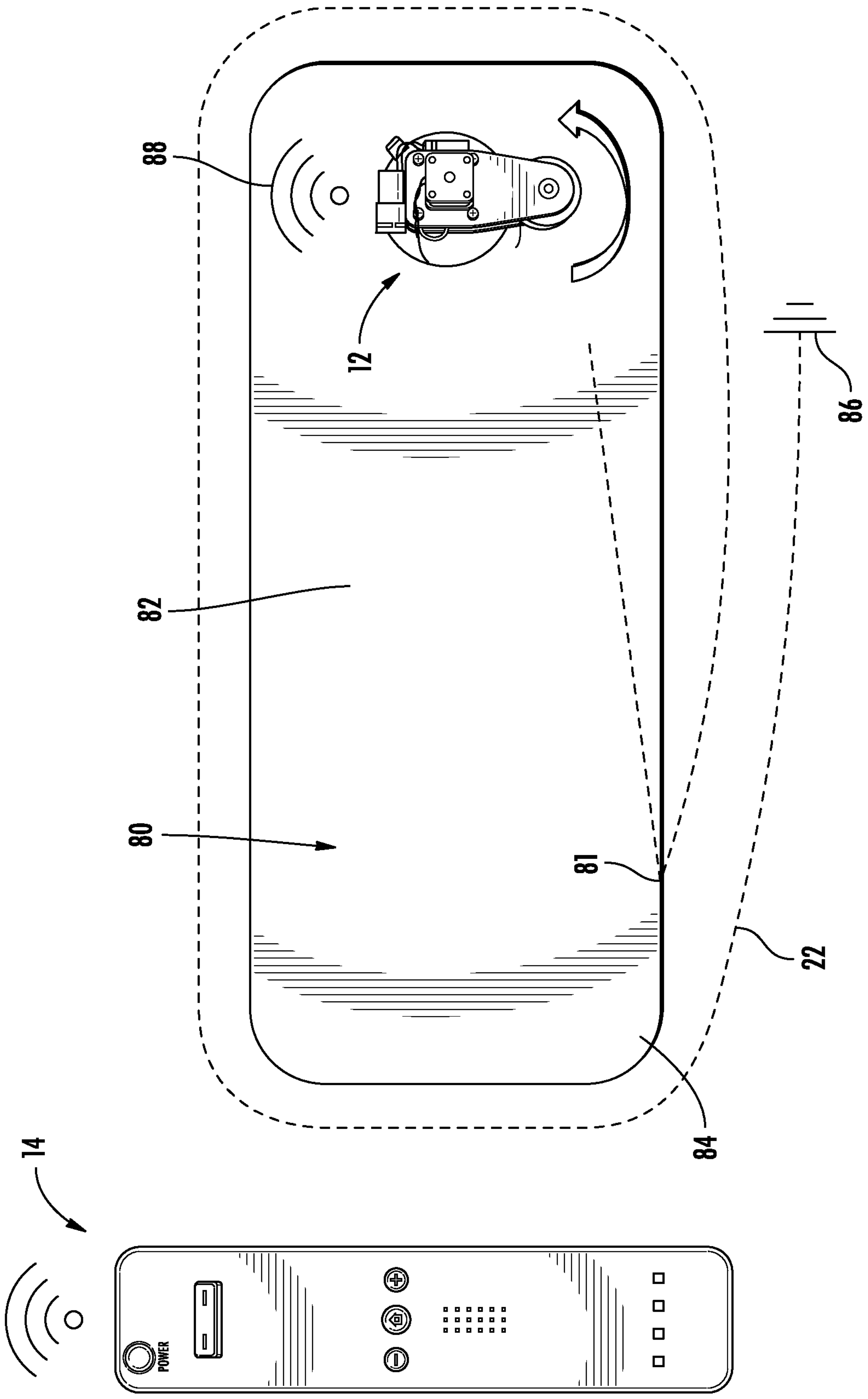
FIG. 7 is a diagram showing the use of the glass removal system of FIG. 1, according to an exemplary embodiment.

Referring to FIG. 7, a diagram showing glass removal system 10 in use, according to an exemplary embodiment is shown. To operate glass removal system 10, a user places cord and wire glass removal tool 12 and specifically suction cup 26 on an inner surface 82 of a piece of glass, shown schematically as windshield 80. The user can press switch 50 to turn on vacuum pump 24 creating a vacuum force to seal suction cup 26 to inner surface 82 of windshield 80. A sealant 84 (e.g., urethane) extends around windshield 80 to hold windshield 80 to the body of an automobile. The cutting medium 22 is threaded through a hole or gap 81 in sealant 84 and cutting medium 22 is extended around an outer surface or the outside of a perimeter of windshield 80 before being secured or anchored to a device, shown as ground or anchor device 86. In other words, an end of the cutting medium 22 extended around the outer surface of windshield 80 is coupled to anchor 86. The user can remain standing outside of the automobile and press power button 68 to turn on remote control 14 and press the trigger 78 to start motor 18 using wireless communication with cord and wire glass removal tool 12 using Wi-fi 88. Motor 18 drives the retraction of cutting medium 22 onto spool 20, creating a cutting force that allows cutting medium 22 is to cut or slice through sealant 84, breaking the connection with windshield 80. In some embodiments, cord and wire glass removal tool 12 may need to be repositioned on the windshield during the windshield removal process. In other embodiments, cord and wire glass removal tool 12 may be placed on the windshield a single time during the windshield removal process.

Figure 8:
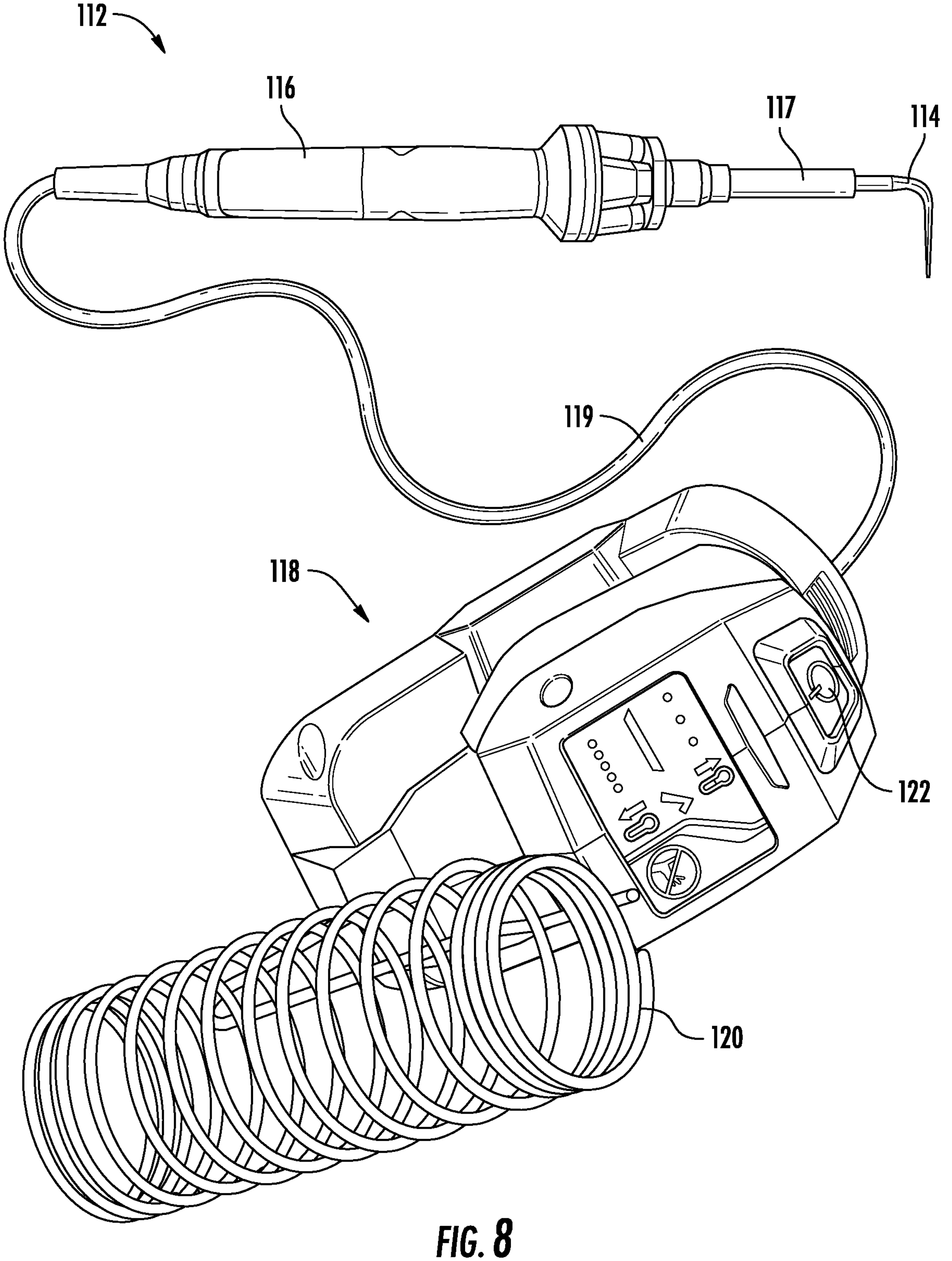
FIG. 8 is a perspective view of a hot knife glass removal tool, according to an exemplary embodiment.
Figure 9:
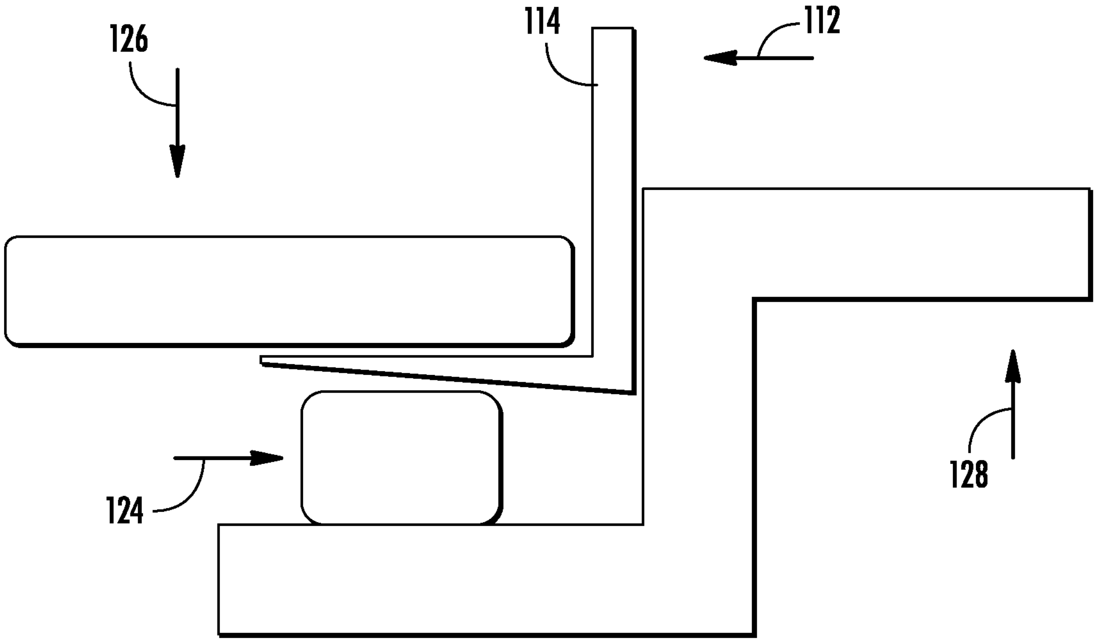
FIG. 9 is a diagram showing the use of the glass removal tool of FIG. 8, according to an exemplary embodiment.
Figure 10:
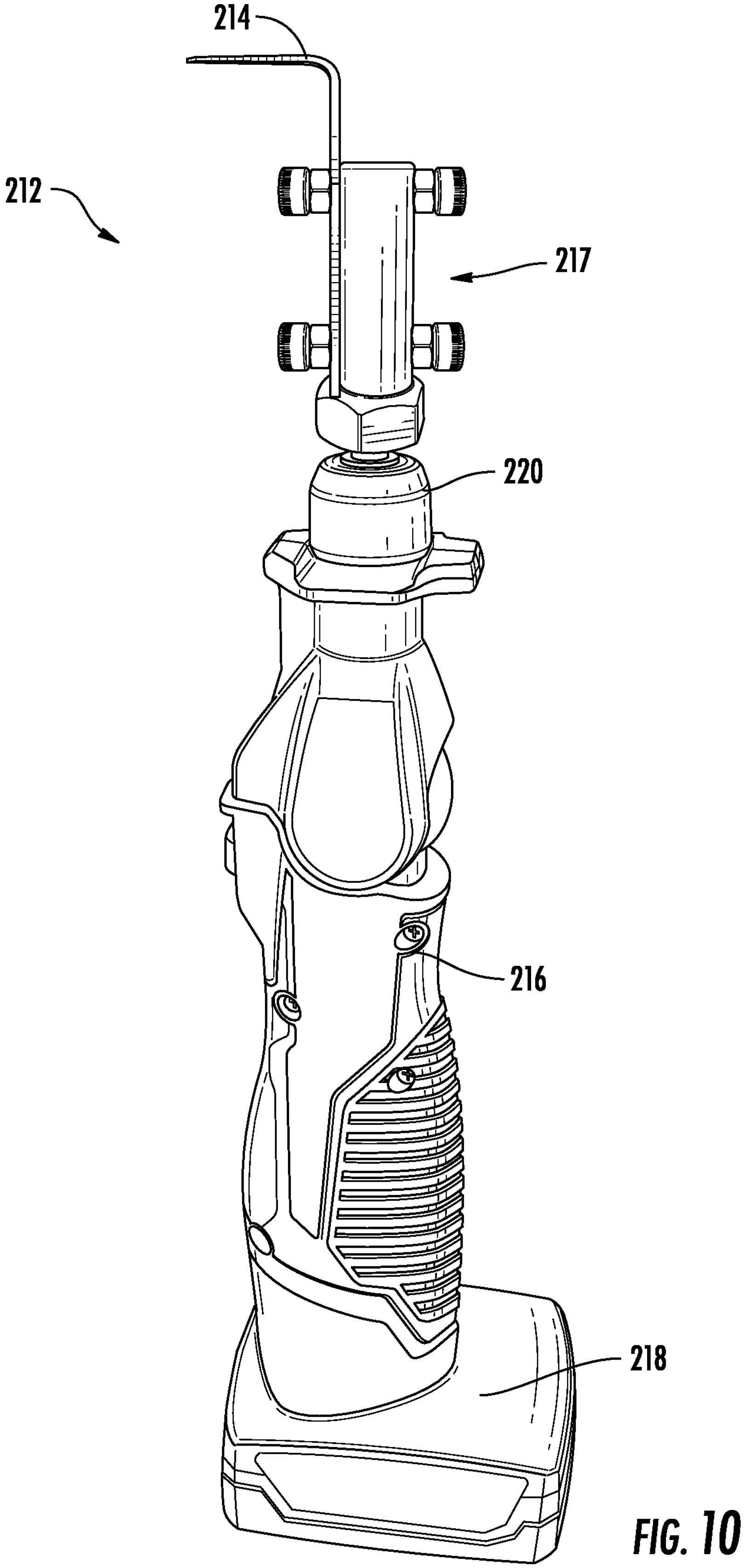
FIG. 10 is a perspective view of a hot knife glass removal tool, according to another exemplary embodiment.
Figure 11:
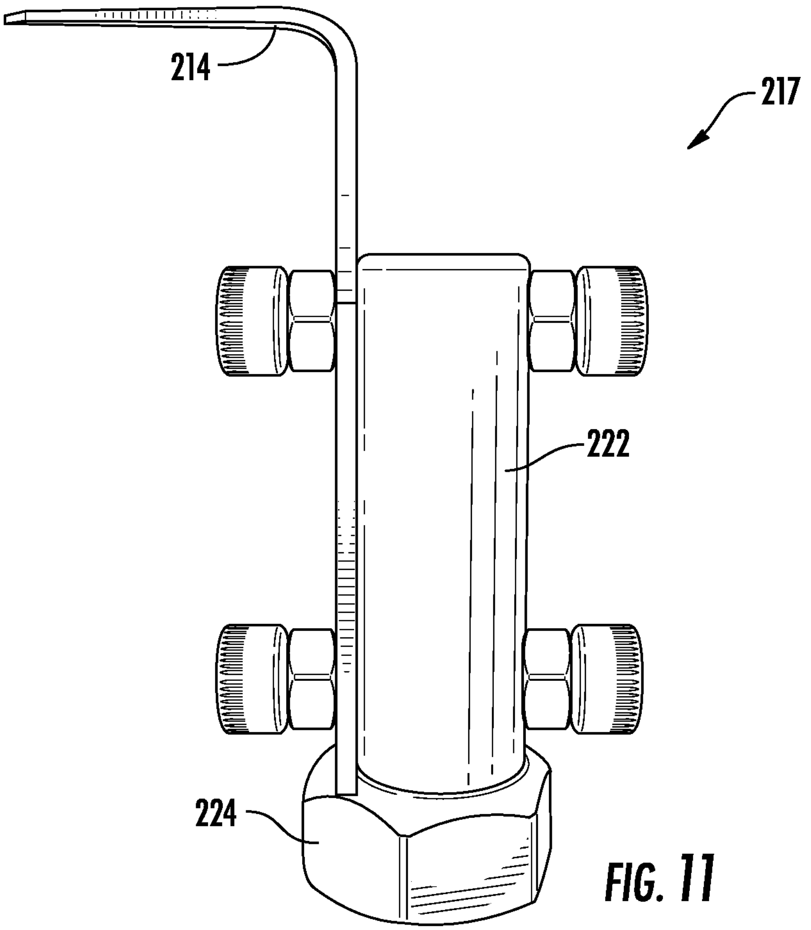
FIG. 11 is a right-side perspective view of a tip portion of the hot knife glass removal tool of FIG. 10, according to an exemplary embodiment.
Figure 12:
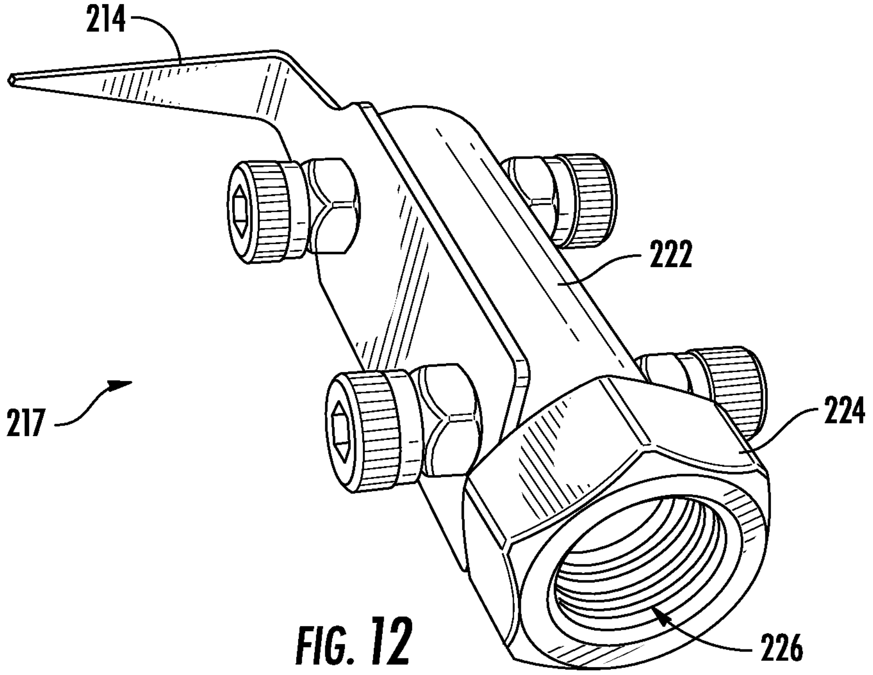
FIG. 12 is a perspective view from below of the tip portion of the hot knife glass removal tool of FIG. 10, according to an exemplary embodiment.
Figure 13:
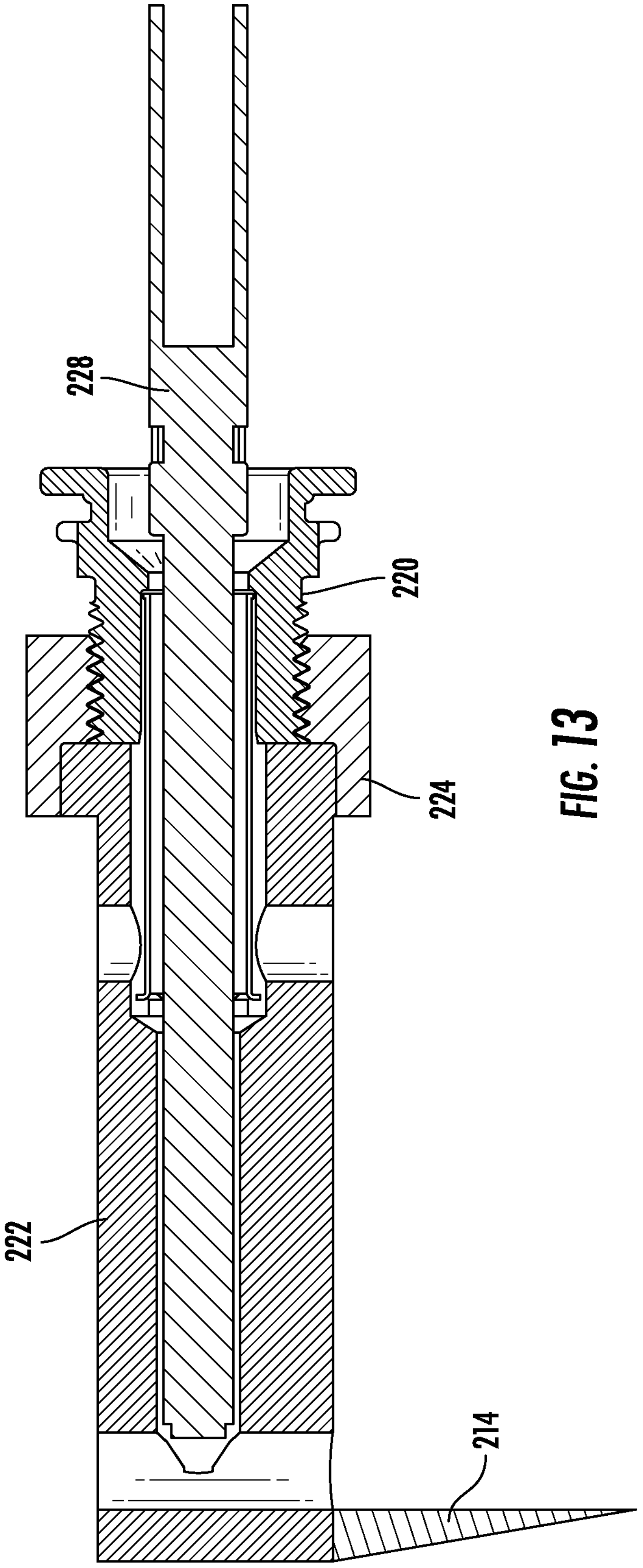
FIG. 13 is a cross sectional view of the hot knife glass removal tool of FIG. 10, according to an exemplary embodiment.

Referring to FIGS. 8-9, various aspects of a heated tool, shown as hot knife 112 are shown. As discussed herein, Applicant has developed a number of improvements to the functionality of the glass removal knife. In contrast to the glass removal knife discussed herein, conventional glass removal knives are not heated (i.e., cold knives) which require a user to apply a greater force to cut through a sealant, such as urethane to remove the windshield from its position on the body of the automobile. In a specific embodiment, hot knife 112 is a soldering iron with an angled knife tip 114. In other embodiments, the hot knife may be another type of hand tool with a heating element that includes a knife tip.

Hot knife 112 includes a tool body 116 with a tip portion 117 configured to receive and couple to angled knife tip 114 and a base 118. In general, hot knife 112 includes various components for generating heat (e.g., heating element) positioned within tool body 116 and/or base 118. Base 118 includes a power cord 119, a power button 122, and a stand portion 120 to hold the tool body 116. Within base 118 are control electronics (e.g., printed circuit board assembly, temperature controller, etc.).

Referring to FIG. 9, a diagram showing hot knife 112 in use, is shown according to an exemplary embodiment. A user can connect power cord 119 to a power source and press power button 122 to heat up hot knife 112. The heated angled knife tip 114 can then be used to cut through a sealant 124 (e.g., urethane), that couples a windshield 126 to the body of an automobile 128 (both shown schematically).

Referring to FIGS. 10-13, various aspects of a heated tool, shown as hot knife 212 are shown. Hot knife 212 is substantially the same as hot knife 112 except for the differences discussed herein. Hot knife 212 uses a rechargeable power tool battery, such as a lithium-ion power tool battery 218 that can be coupled to an end of tool body 216. A distal end 220, opposing the end of tool body 216 with power tool battery 218, is coupled to a tip portion 217.

An angled knife tip 214 is fastened to tip portion 217 of hot knife 212. Tip portion 217 includes a main body 222 and a connection end 224 that is removably coupled to distal end 220 of tool body 216. Connection end 224 includes a bore 226 to receive distal end 220. In a specific embodiment, tip portion 217 is threadably coupled to distal end 220. A heating element 228 extends through tool body 216 and tip portion 217 to heat angled knife tip 214.

Figure 14:
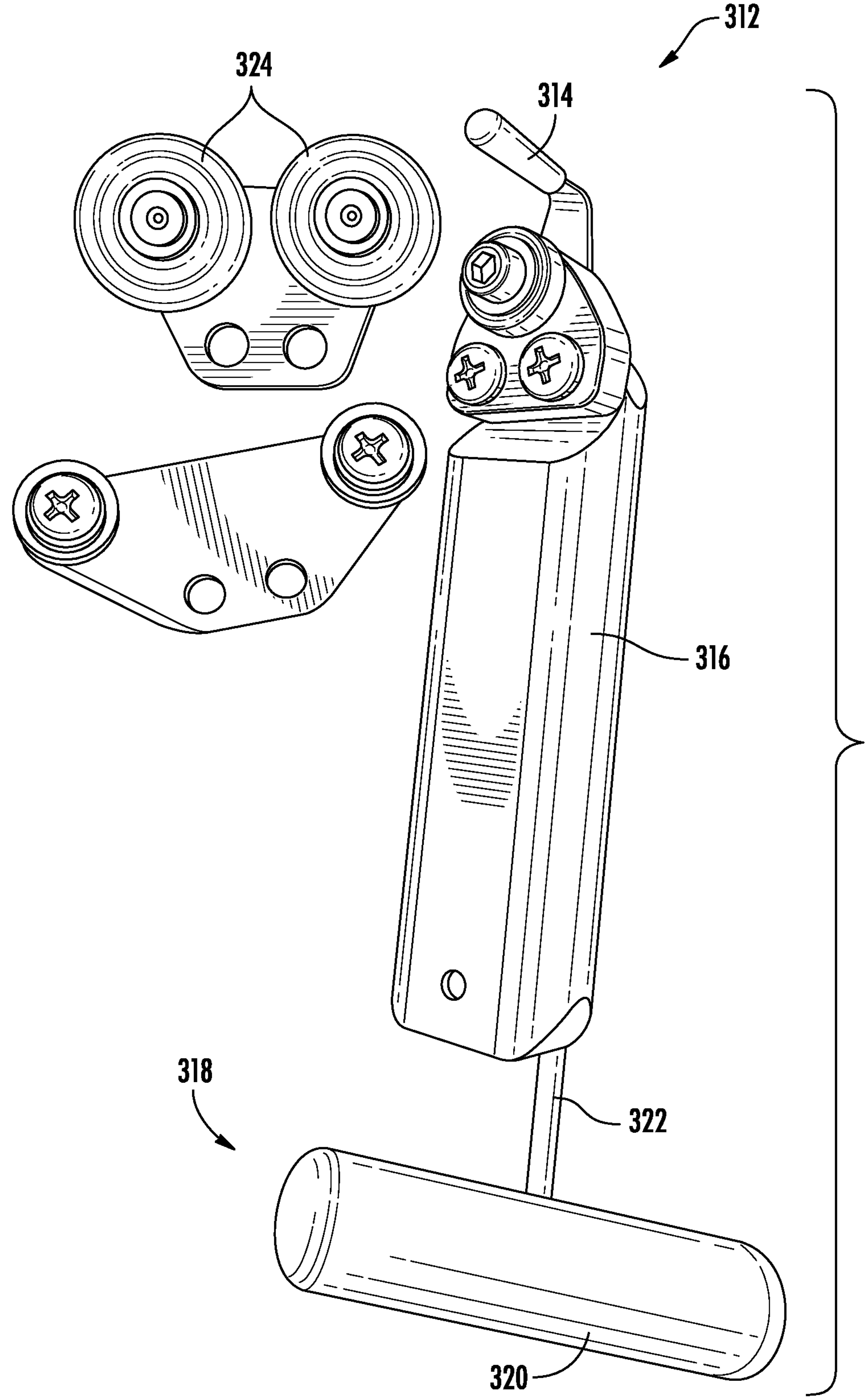
FIG. 14 is an exploded view of a cold knife glass removal tool, according to an exemplary embodiment.

Referring to FIG. 14, various aspects of a cold glass removal tool, shown as cold knife 312 are shown according to an exemplary embodiment. Applicant has developed a number of improvements to the functionality of the cold knife. In contrast to the glass removal knife discussed herein, conventional glass removal knives include a depth stop to determine the depth of the cut. The cold knives discussed herein, use wheels or rollers to keep the knife generally parallel with respect to the glass during the sealant removal.

Cold knife 312 includes angled knife tip 314, a tool body 316, a T-handle 318 and one or more wheels 324. The T-handle 320 includes a grip portion 320 and a connection portion 322 oriented in a generally perpendicular direction relative to the grip portion 320 of the T-handle 318. The connection portion 322 is coupled to the angled knife tip 314 such that when a user pulls the grip portion 320 a force is transmitted through the cold knife 312 allowing the user to cut through the sealant. The wheels 324 are coupled to the end of the tool body 316 adjacent to the angled knife tip 314. When a user attempts to cut the glass sealant, the wheels 324 help keep the knife 312 parallel with the glass so that the cut maintains a consistent depth throughout the removal process.

Figure 15:
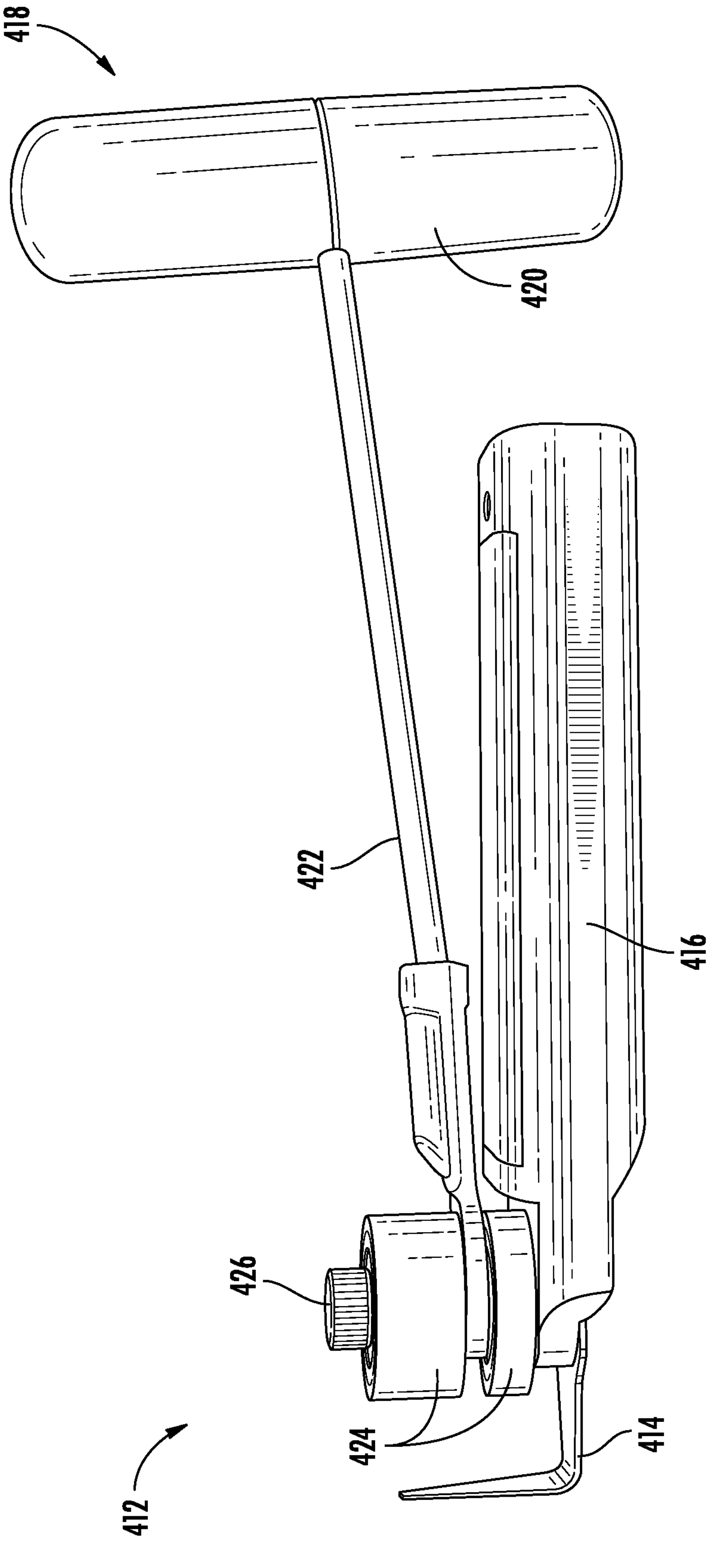
FIG. 15 is a left-side perspective view of a cold knife glass removal tool, according to another exemplary embodiment.
Figure 16:
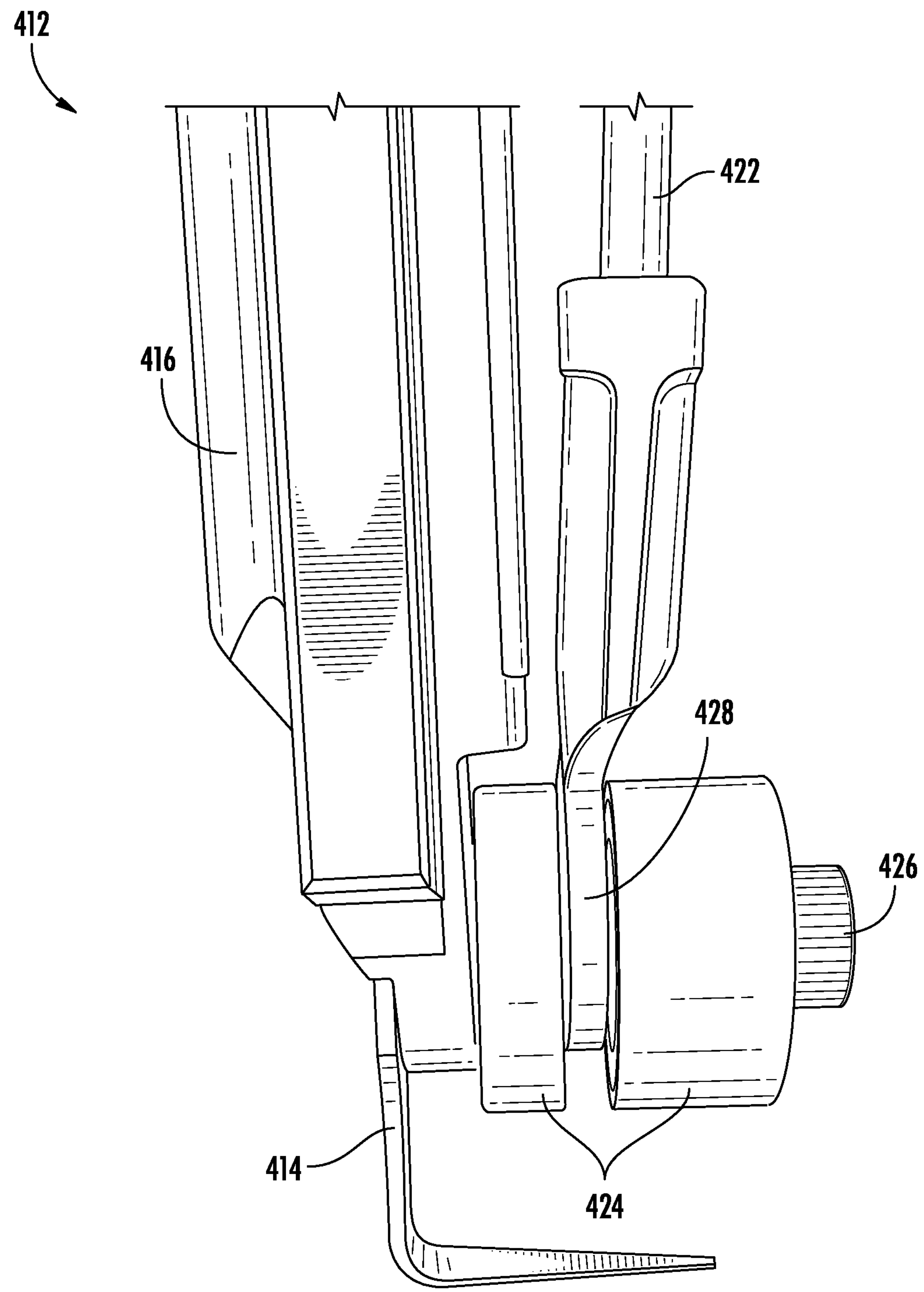
FIG. 16 is a right-side perspective view of the cold knife glass removal tool of FIG. 15, according to an exemplary embodiment.
Figure 17:
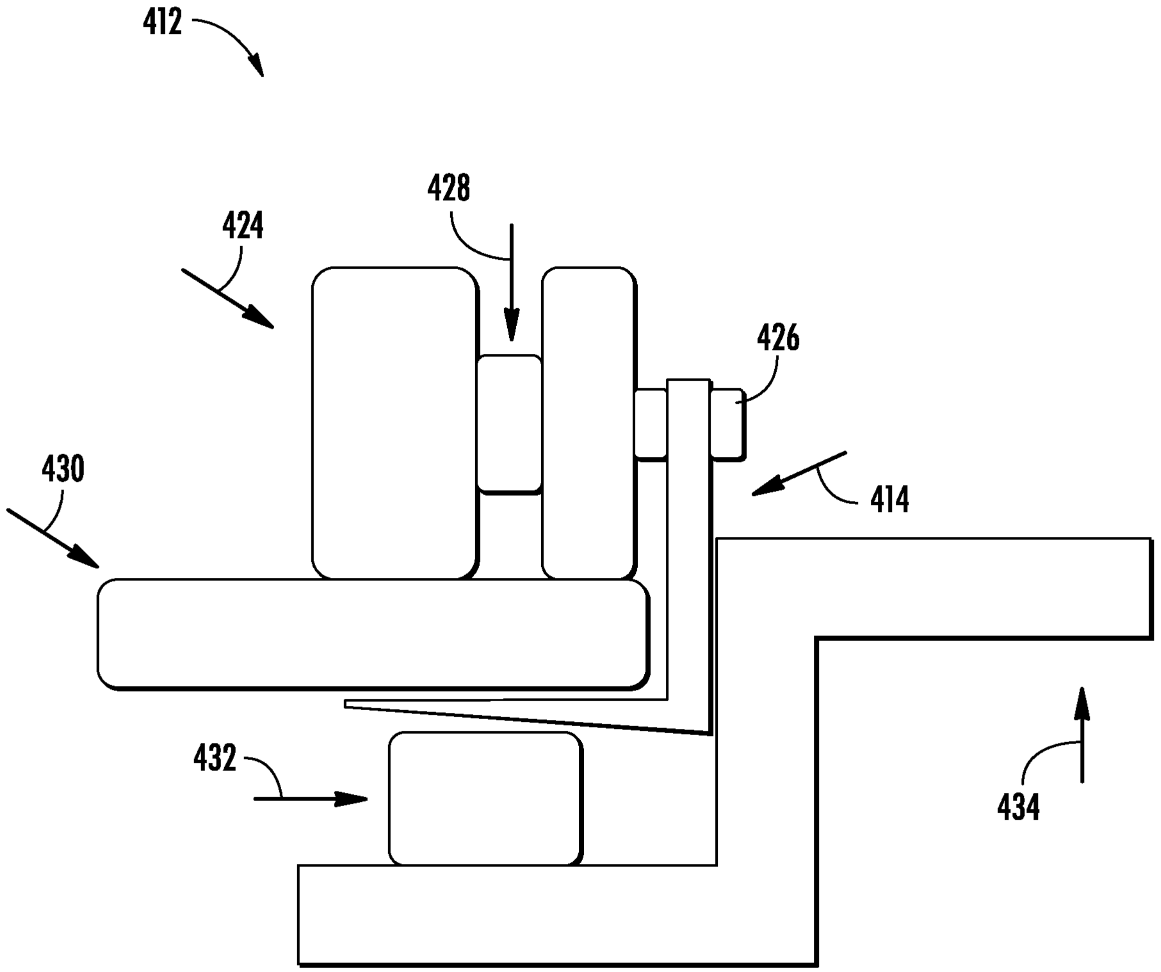
FIG. 17 is a diagram showing the use of the glass removal tool of FIG. 15, according to an exemplary embodiment.

Referring to FIGS. 15-17, various aspects of cold glass removal tool, shown as cold knife 412 are shown. Cold knife 412 is substantially the same as cold knife 312 except for the differences discussed herein. Cold knife 412 includes an angled knife tip 414, a tool body 416, a T-handle 418, and one or more rollers 424. The T-handle 420 includes a grip portion 420 and a connection portion 422 oriented in a generally perpendicular direction relative to the grip portion 420 of the T-handle 418. The connection portion 422 is coupled to the angled knife tip 414 such that when a user pulls the grip portion 420 a force is transmitted through the cold knife 412 allowing the user to cut through the sealant. The rollers 424 are positioned on both sides of an attachment end 428 of the T-handle 410 and are coupled to the end of the tool body 416 adjacent to the angled knife tip 414. The rollers 424, attachment end 428 and angled knife tip 414 are connected by a fastener 426. The T-handle 410 attachment is positioned above (orientation shown in FIG. 17) so that the pulling force exerted on T-handle 410 does not rotate and/or twist angled knife tip 414 out of position during the cutting process.

Referring to FIG. 17, a diagram showing cold knife 412 in use, is shown according to an exemplary embodiment. A user can position the rollers 424 against the windshield 430, shown schematically. The angled knife tip 414 can then be used to cut through a sealant 432 (e.g., urethane), shown schematically that couples the windshield 430 to the body of an automobile 434, shown schematically.

Figure 18:
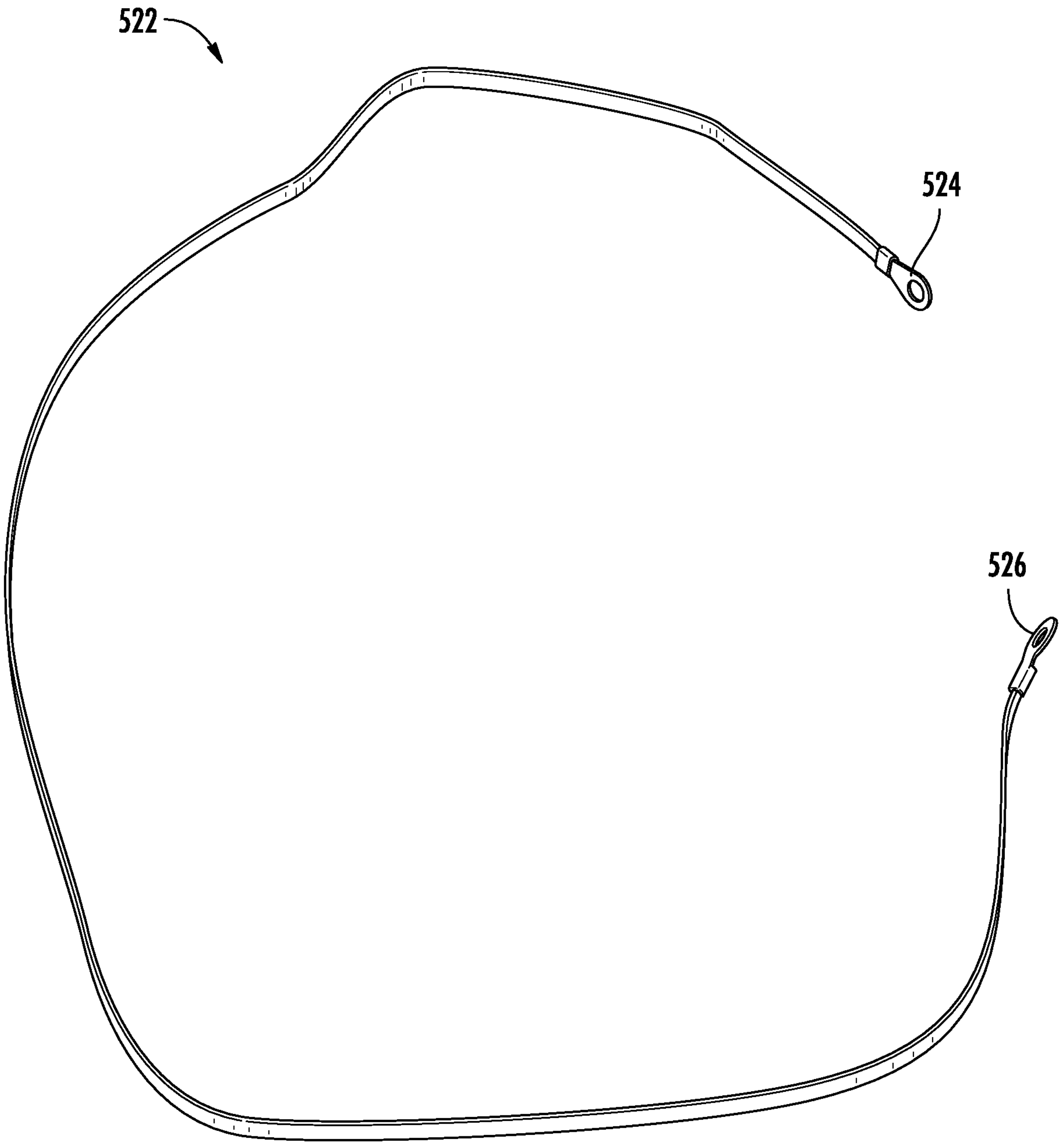
FIG. 18 is a heated wire that can be utilized with a cord and wire glass removal tool, according to an exemplary embodiment.

Referring to FIG. 18, a cutting medium, shown as a heated wire 522 is shown according to an exemplary embodiment. Heated wire 522 can be utilized with a cord and wire glass removal tool like tool 12 with the addition of a heating assembly (e.g., heating element, controller etc.). In contrast to a cutting medium (e.g., cord or wire) that is not heated, a heated wire can cut through a sealant using less force to remove the windshield from an automobile. Heated wire 522 includes a first end 524 that can be coupled to the heating assembly of the cord and wire cutting tool and a second end 526 that opposes first end 524. Second end 526 can extending through a gap in the sealant of the windshield to cut through the sealant in the same way cutting medium 22 is used (see e.g., FIG. 7).

Figure 19:
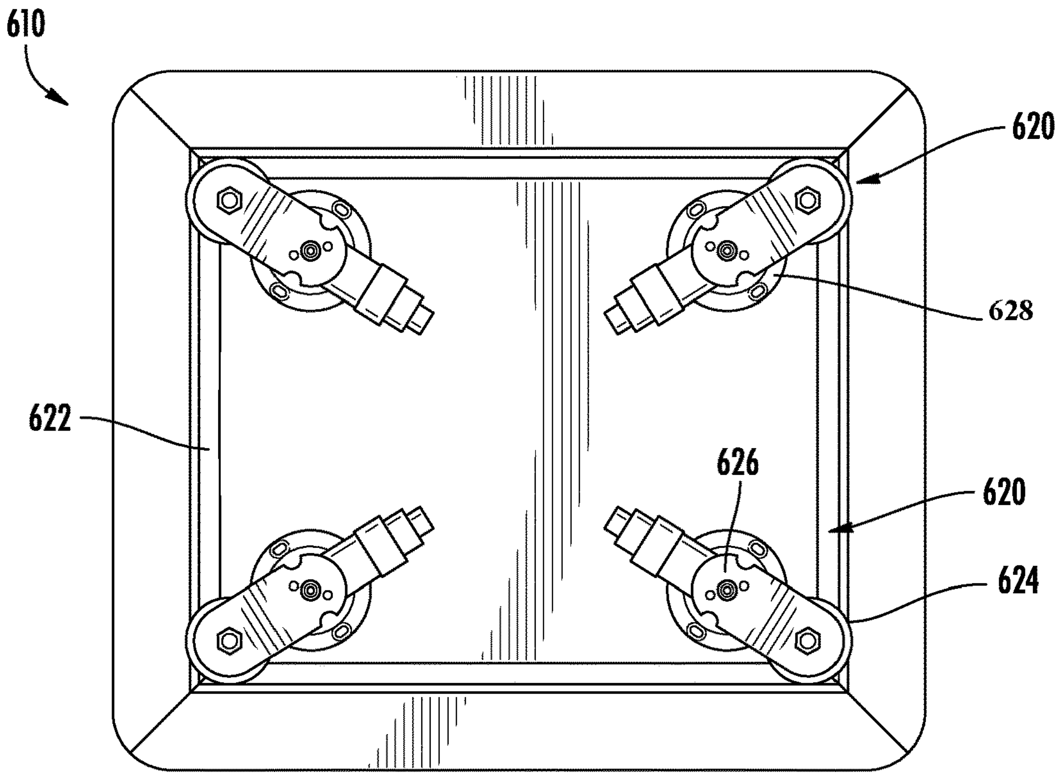
FIG. 19 is a perspective view of a setup system that can be utilized with a cord and wire glass removal tool, according to an exemplary embodiment.
Figure 20:
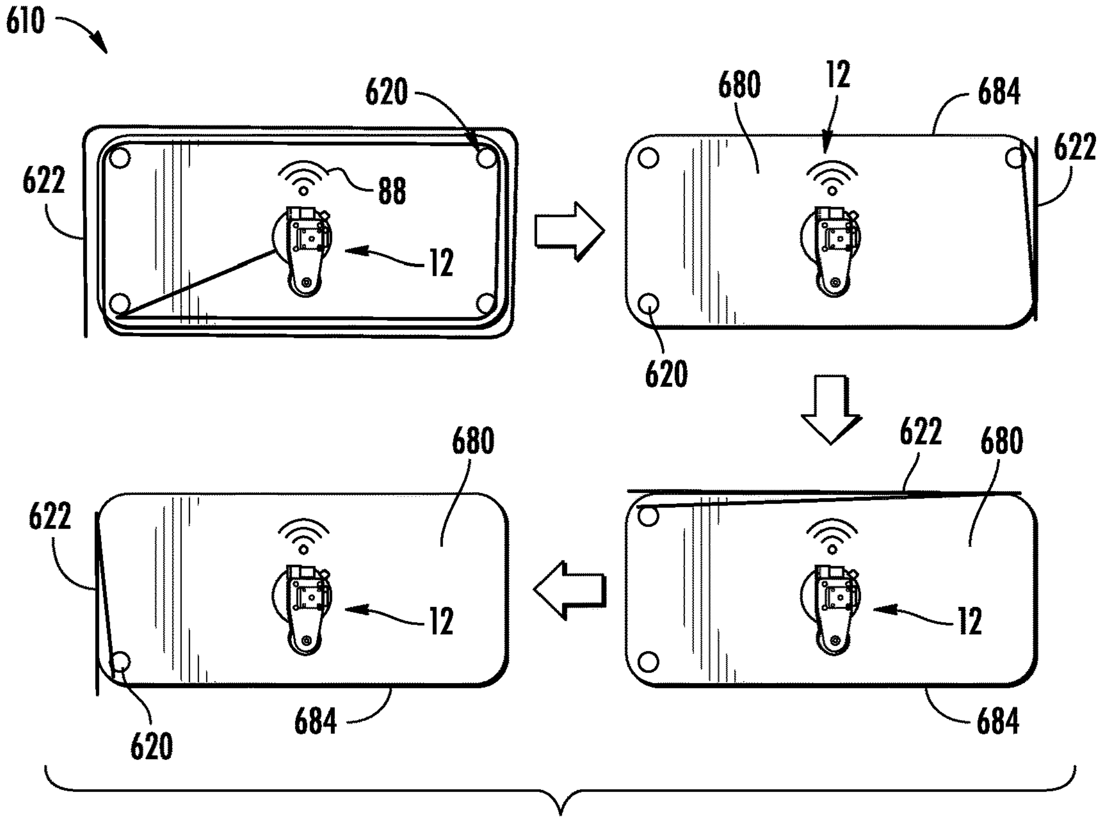
FIG. 20 is a diagram showing the use of the setup system of FIG. 19 with a cord and wire glass removal tool, according to an exemplary embodiment.

Referring to FIGS. 19-20, various aspects of a setup system 610 that can be utilized with cord and wire glass removal tool 12 is shown, according to an exemplary embodiment. The setup system 610 allows cord and wire glass removal tool 12 and remote control 14 (see e.g., FIG. 5) to be utilized for glass removal after a single placement by creating a linear relationship between the cutting force and an angle of the cutting medium. In other words, the cutting medium retainers are placed on the inner surface of windshield 680 or the glass being cut in locations such that a linear relationship between the cutting force and an angle of the cutting medium 622 is created, allowing the sealant 684 to be removed after a single placement of cord and wire glass removal tool 12. Setup system 610 includes a plurality of cutting medium retainers 620. Each cutting medium retainer 620 includes a suction cup portion 628 allowing for coupling to glass, a retaining portion 624 to engage and/or support the cutting medium 622, and a body 626 that connects suction cup portion 628 to retaining portion 624.

Referring to FIG. 20, a diagram showing setup system 610 in use is shown, according to an exemplary embodiment. In a specific embodiment, four cutting medium retainers 620 are placed on the inside of a windshield 680, shown schematically with a cutting medium retainer 620 positioned in each corner of the corners of the windshield 680 or glass being removed. In other words, when there are four cutting medium retainers 620 one of the four cutting medium retainers 620 is positioned on the inner surface of the windshield 680 in each corner of the windshield 680. A cutting medium 622 is extended through a gap in the sealant, shown as urethane 684 and wrapped around the cutting retainers 620 as shown in order to maintain the relationship between force and angle such that cord and wire cutting tool 12 only needs to be placed on the inner surface of the windshield a single time during the windshield removal process.

Figure 21:
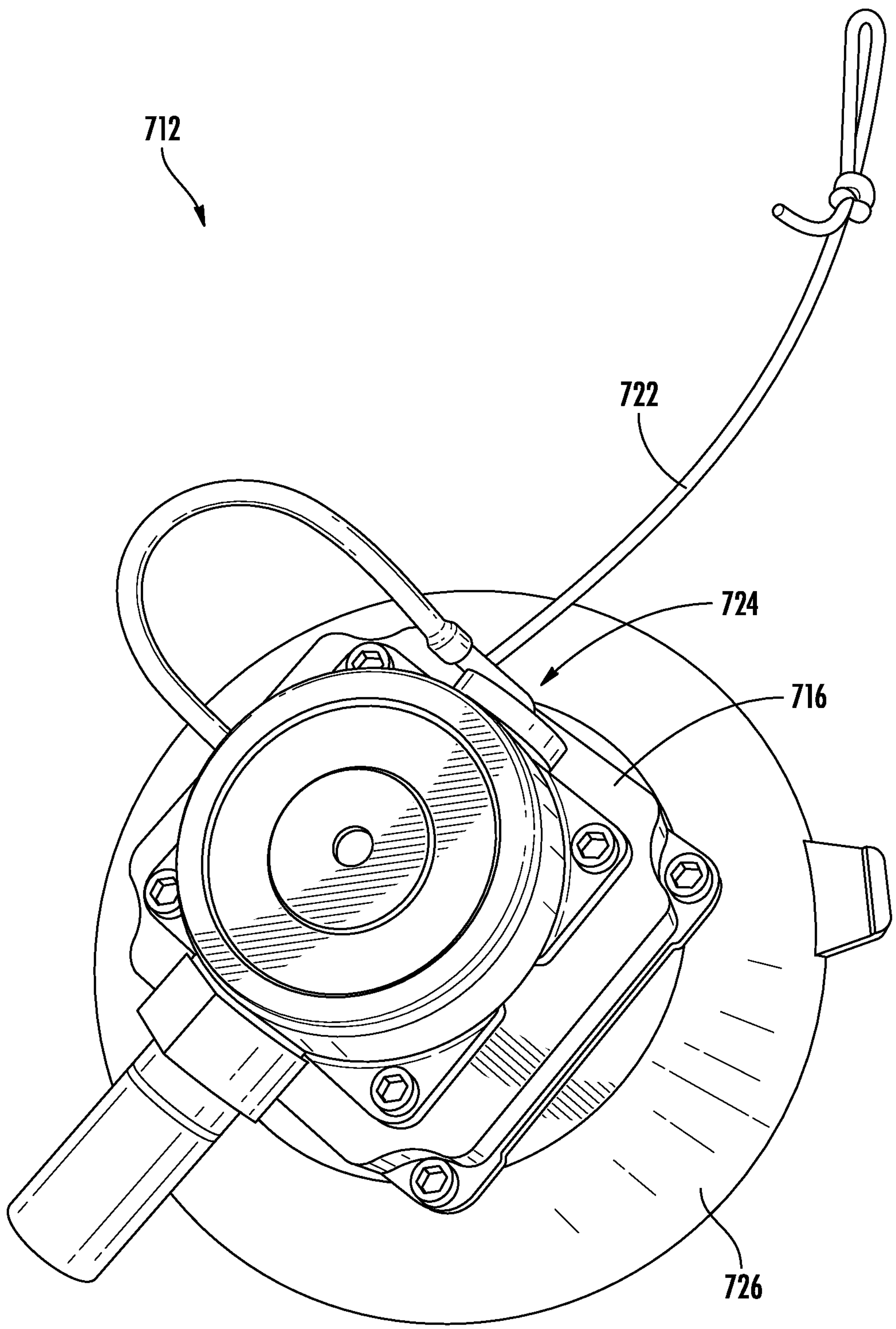
FIG. 21 is a cord and wire glass removal tool, according to another exemplary embodiment.
Figure 22:
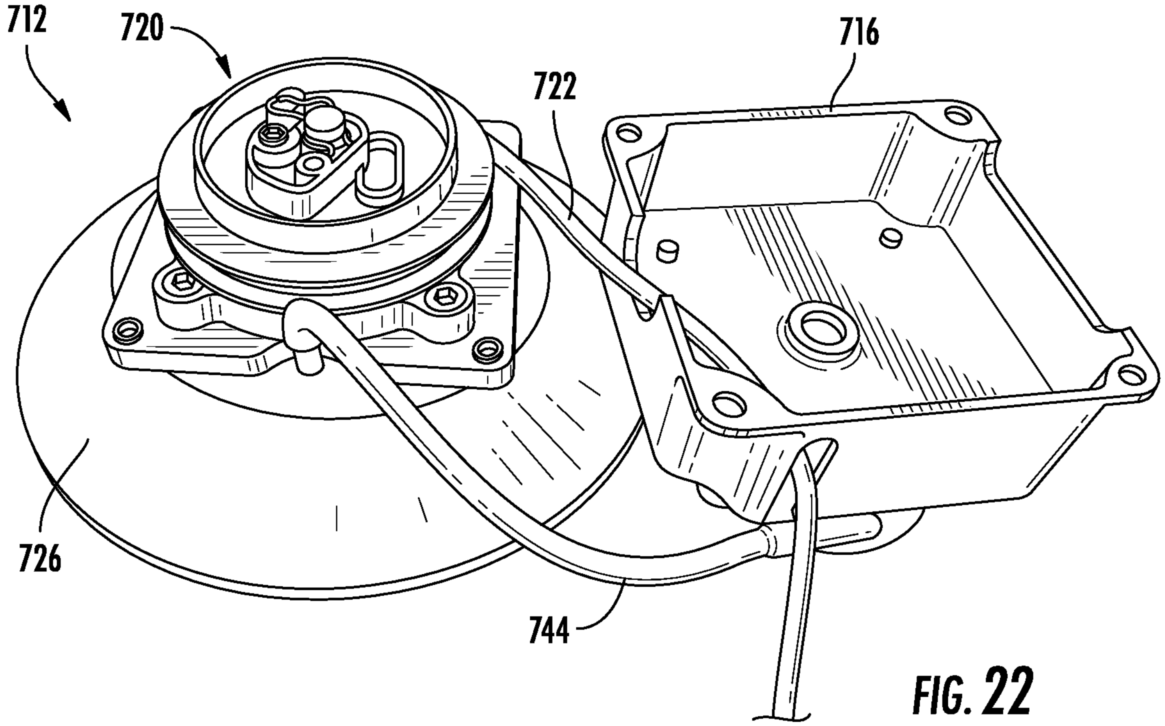
FIG. 22 is the cord and wire glass removal tool of FIG. 21 with the housing portion removed, according to an exemplary embodiment.
Figure 23:
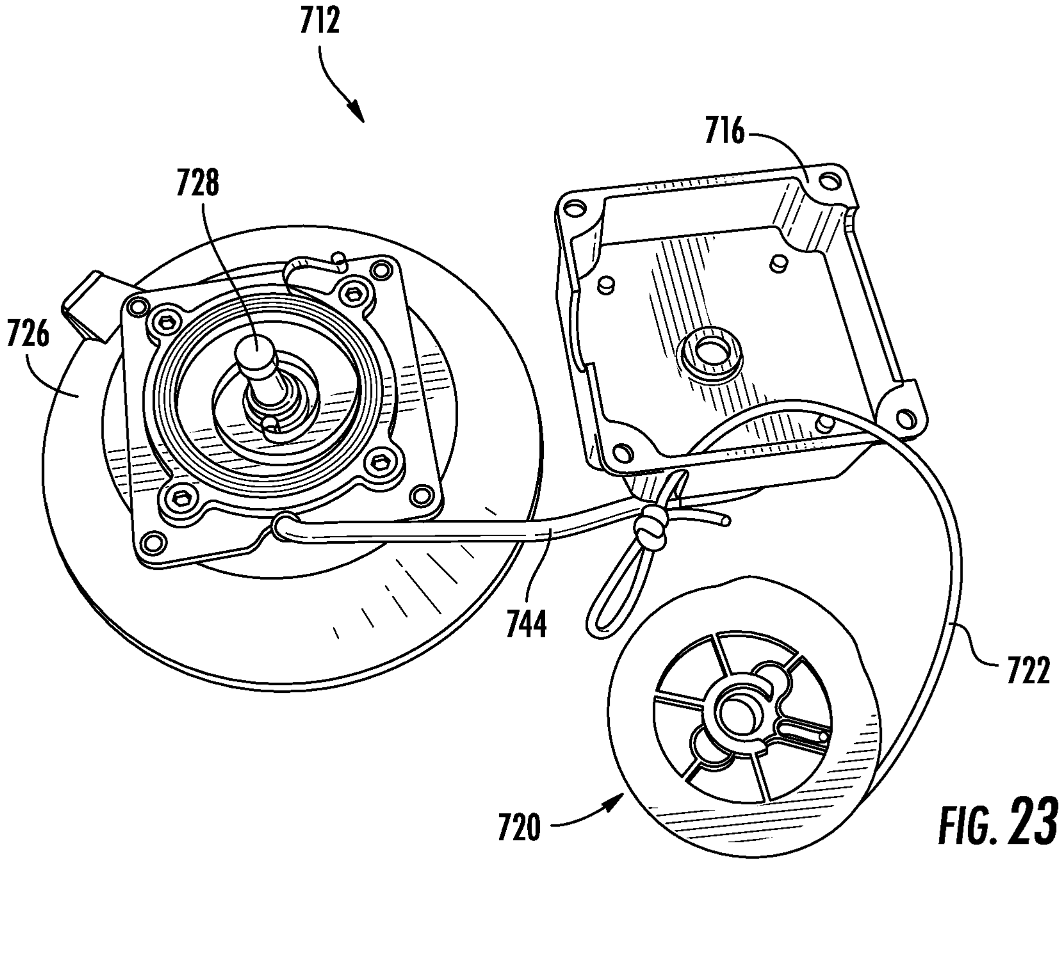
FIG. 23 is the cord and wire glass removal tool of FIG. 21 with the housing portion and the spool removed, according to an exemplary embodiment.

Referring to FIGS. 21-23, various aspects of a tool, shown as cord and wire glass removal tool 712, are shown. Cord and wire glass removal tool 712 is substantially the same as cord and wire glass removal tool 12 except for the differences discussed herein. Cord and wire glass removal tool 712 includes an attachment mechanism, shown as suction cup 726, a vacuum pump 724, a spool 720, and housing 716.

The spool 720 is rotatable about an axle 728 and cutting medium 722 wound around spool 720. The housing 716 encloses spool 720 and axle 728. Vacuum pump 724 is coupled to suction cup 726 by hose or tube 744. Cord and wire cutting tool 712 can be connected to and powered by a power tool such as a reciprocating saw (see e.g., FIG. 24). Attachment to a reciprocating saw can reduce the time it takes to remove a windshield.

Figure 24:
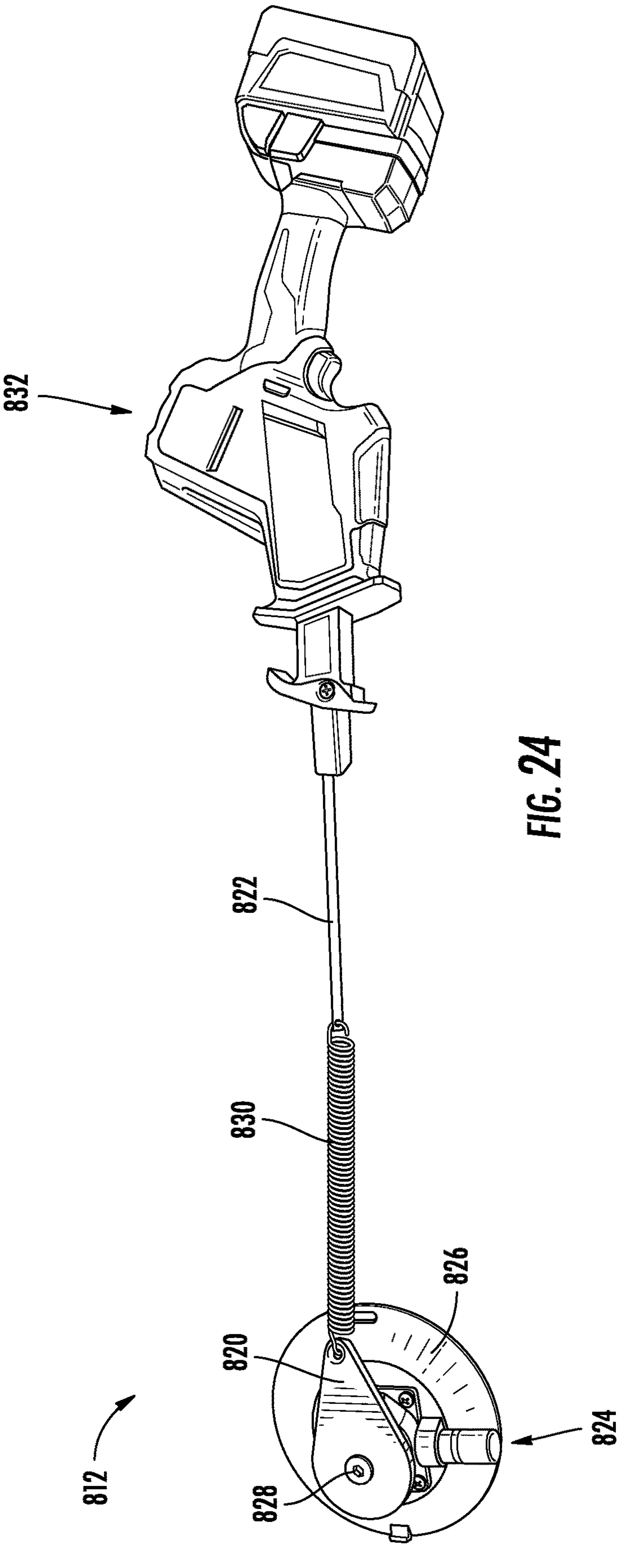
FIG. 24 is a cord and wire glass removal tool, according to another exemplary embodiment.

Referring to FIG. 24, various aspects of a tool, shown as a cord and wire glass removal tool 812, are shown. Cord and wire glass removal tool 812 is substantially the same as cord and wire glass removal tools 12 and 712 except for the differences discussed herein. Cord and wire glass removal tool 812 includes a suction cup 826, a vacuum pump 824, a rotatable connector 820, a spring 830, and a power tool 832. Rotatable connector 820 is positioned above suction cup 826 and is rotatable about an axle 828. A spring 830 is coupled to rotatable connector 820 on a first end and is coupled to a cutting medium 822 on a second end.

When in use, cord and wire glass removal tool 812 can be placed on an inside surface of the windshield while the cutting medium 822 is extended through the sealant to the outside of the automobile. The cutting medium 822 is then connected to a power tool, shown as a one-handed reciprocating saw 832. The design of the reciprocating saw 832 allows a user to quickly cut through the sealant surrounding the windshield.

Figure 25:
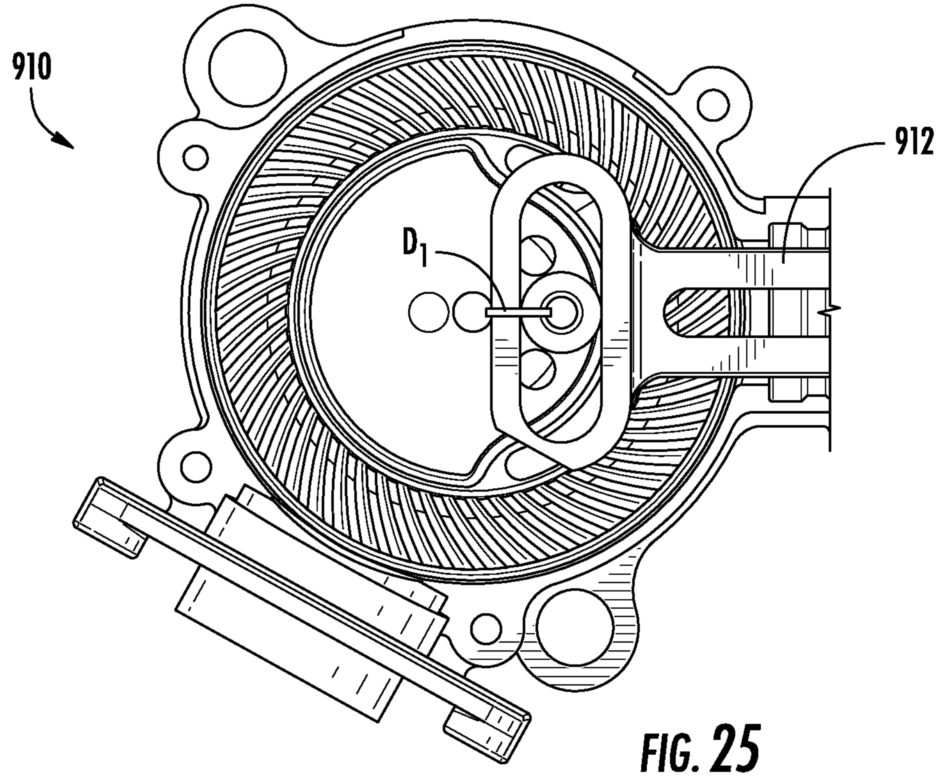
FIG. 25 is a cross-sectional view of a portion of a reciprocating saw that can be utilized with a cord and wire glass removal tool, according to an exemplary embodiment.
Figure 26:
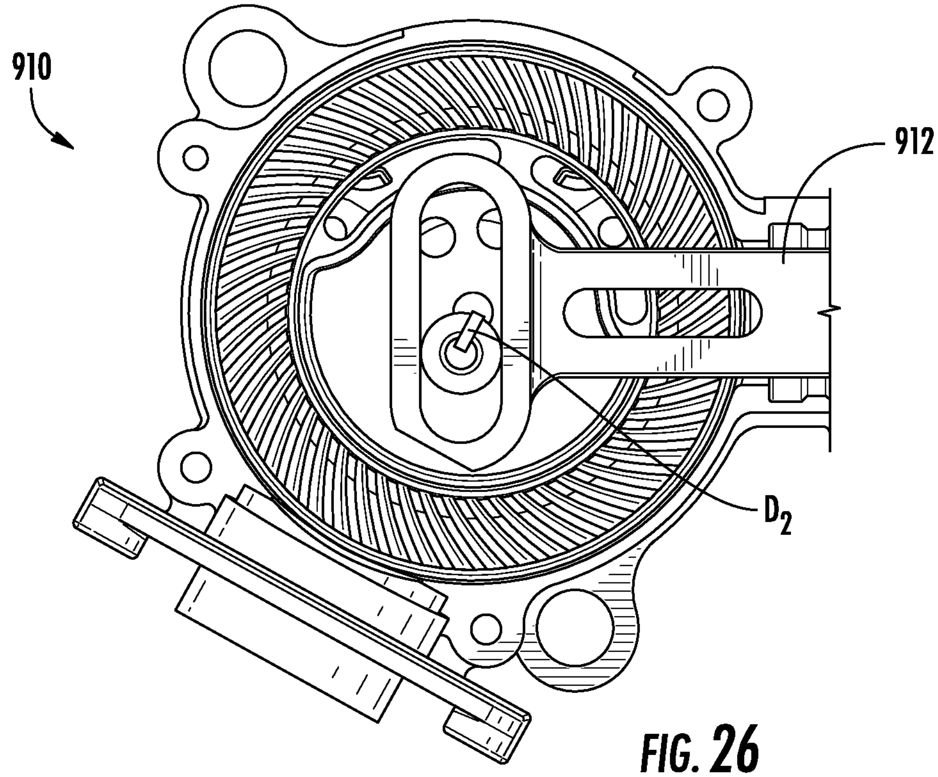
FIG. 26 is a cross-sectional view of a portion of a reciprocating saw that can be utilized with a cord and wire glass removal tool, according to another exemplary embodiment.

Referring to FIGS. 25-26, various aspects of a power tool that can be utilized with cord and wire cutting tools are shown according to an exemplary embodiment. FIG. 25 shows a power tool, shown as a reciprocating saw 910 with a first stroke length D1, where stroke length is the distance the blade travels during the cutting motion. FIG. 26 shows reciprocating saw 910 with a second stroke length D2. In a specific embodiment, D1 is between 15 mm and 25 mm and more specifically between 20 mm and 24 mm. In such an embodiment, D1 is about 22.5 mm (e.g., 22.5 mm±0.5 mm). In a specific embodiment, D2 is between 5 mm and 15 mm and more specifically between 9 mm and 14 mm. In such an embodiment, D2 is about 11.5 mm (e.g., 11.5 mm±0.5 mm). The reduced stroke length of the reciprocating saw described herein allows for increased precision during the glass removal process. Reducing the stroke length of the reciprocating saw allows a user to ensure there is no damage caused to the body of the automobile while the saw is reciprocating.

Figure 27:
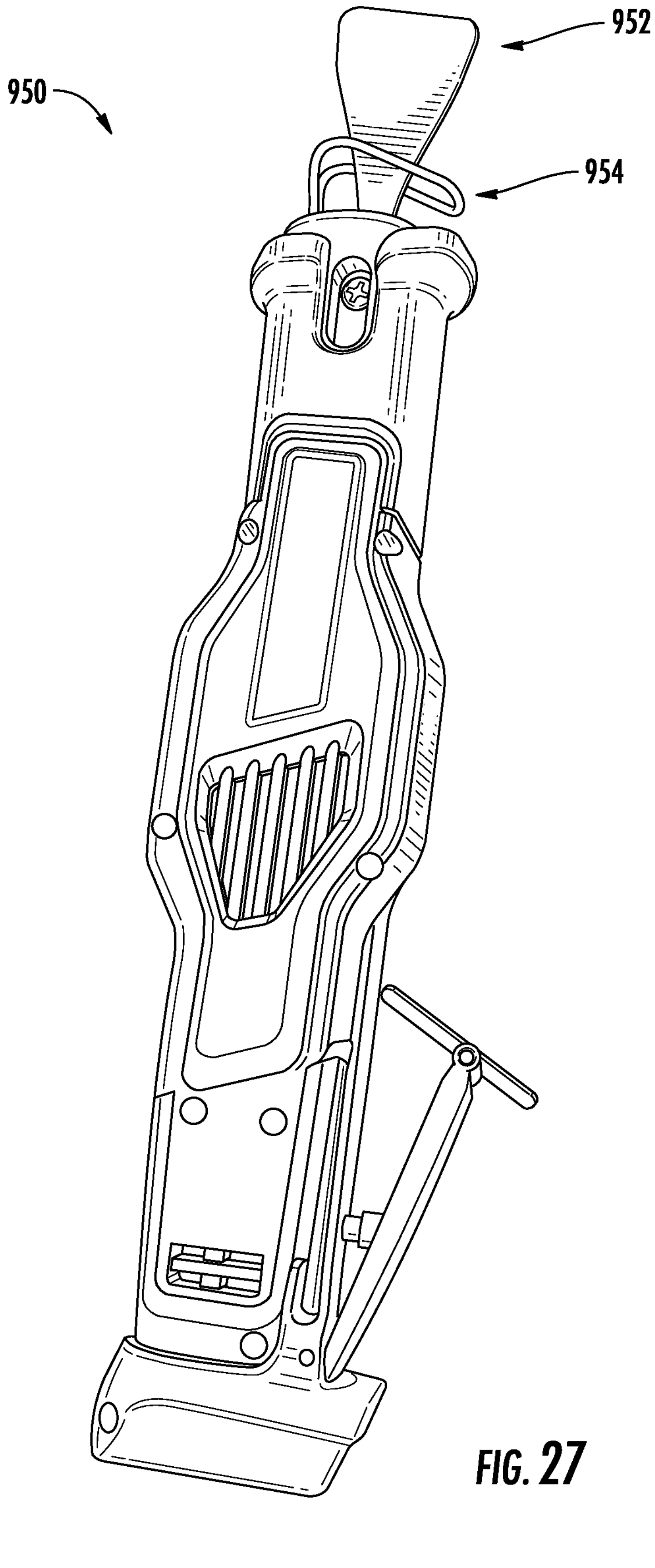
FIG. 27 is a perspective view of a reciprocating saw, according to an exemplary embodiment.
Figure 28:
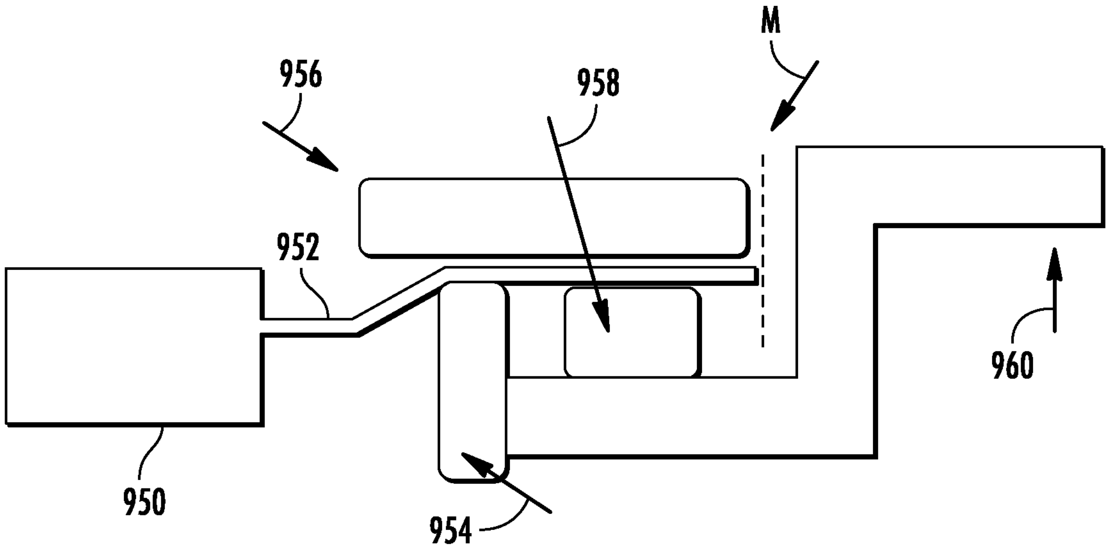
FIG. 28 is a diagram showing the use of the reciprocating saw of FIG. 27, according to an exemplary embodiment.

Referring to FIGS. 27-28, various aspects of glass removal tool, shown as reciprocating saw 950 are shown, according to an exemplary embodiment. Reciprocating saw 950 includes a flexible blade 952 and a blade guide 954 coupled to the blade 952. Referring to FIG. 29, a diagram showing reciprocating saw 950 in use is shown, according to an exemplary embodiment. The blade 952 of reciprocating saw 950 extends generally parallel to the windshield 956, shown schematically. The sealant 958 is cut by the blade 952. The blade guide 954 prevents the blade 952 from extending beyond M, the maximum cut depth. The positioning of blade guide 954 determines M which should be chosen to ensure damage to the automobile 960 (shown schematically) is avoided.

It should be understood that the figures illustrate the exemplary embodiments in detail, and it should be understood that the present application is not limited to the details or methodology set forth in the description or illustrated in the figures. It should also be understood that the terminology is for the purpose of description only and should not be regarded as limiting.

Further modifications and alternative embodiments of various aspects of the invention will be apparent to those skilled in the art in view of this description. Accordingly, this description is to be construed as illustrative only. The construction and arrangements, shown in the various exemplary embodiments, are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Some elements shown as integrally formed may be constructed of multiple parts or elements, the position of elements may be reversed or otherwise varied, and the nature or number of discrete elements or positions may be altered or varied. The order or sequence of any process, logical algorithm, or method steps may be varied or re-sequenced according to alternative embodiments. Other substitutions, modifications, changes and omissions may also be made in the design, operating conditions and arrangement of the various exemplary embodiments without departing from the scope of the present invention.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more component or element, and is not intended to be construed as meaning only one. As used herein, "rigidly coupled" refers to two components being coupled in a manner such that the components move together in a fixed positional relationship when acted upon by a force.

For purposes of this disclosure, the term "coupled" means the joining of two components directly or indirectly to one another. Such joining may be stationary in nature or movable in nature. Such joining may be achieved with the two members and any additional intermediate members being integrally formed as a single unitary body with one another or with the two members or the two members and any additional member being attached to one another. Such joining may be permanent in nature or alternatively may be removable or releasable in nature.

Various embodiments of the disclosure relate to any combination of any of the features, and any such combination of features may be claimed in this or future applications. Any of the features, elements or components of any of the exemplary embodiments discussed above may be utilized alone or in combination with any of the features, elements or components of any of the other embodiments discussed above.

While the current application recites particular combinations of features in the claims appended hereto, various embodiments of the invention relate to any combination of any of the features described herein whether or not such combination is currently claimed, and any such combination of features may be claimed in this or future applications. Any of the features, elements, or components of any of the exemplary embodiments discussed above may be used alone or in combination with any of the features, elements, or components of any of the other embodiments discussed above.

In various exemplary embodiments, the relative dimensions, including angles, lengths and radii, as shown in the Figures are to scale. Actual measurements of the Figures will disclose relative dimensions, angles and proportions of the various exemplary embodiments. Various exemplary embodiments extend to various ranges around the absolute and relative dimensions, angles and proportions that may be determined from the Figures. Various exemplary embodiments include any combination of one or more relative dimensions or angles that may be determined from the Figures. Further, actual dimensions not expressly set out in this description can be determined by using the ratios of dimensions measured in the Figures in combination with the express dimensions set out in this description.

What is claimed is:

1. A glass removal system comprising:
- a glass removal tool comprising:
  - a body;
  - a motor coupled to the body;
  - an axle supported by the body;
  - a spool rotatably mounted to the axle;
  - a cutting medium wound around the spool, the cutting medium is configured to cut through a sealant extending around and holding a piece of glass in place;
  - a transmission system coupled to and extending between the motor and the axle;
  - a vacuum pump coupled to the body and an attachment mechanism, the vacuum pump creating a vacuum force to couple the attachment mechanism to an inner surface of the piece of glass; and
  - a battery, the battery electrically coupled to the motor and the vacuum pump, wherein the battery is positioned on the body, wherein the battery is located between an upper plate and a lower plate of the body, adjacent to the vacuum pomp and below the motor; and a remote control device
- configured to control the motor from a distance away from the glass removal tool;
- wherein the cutting medium is configured to be threaded through a gap in the sealant and extended around an outer surface of the piece of glass and wherein, when the motor drives retraction of the cutting medium onto the spool, a cutting force is created allowing the cutting medium to cut through the sealant.

2. The glass removal system of claim 1, wherein the glass removal tool includes a communication device configured to receive signals from the remote control device and wherein the remote control device includes a trigger configured to generate a command signal to start the motor or configured to adjust a power level of the motor when received by the communication device of the glass removal tool.

3. The glass removal system of claim 2, wherein the remote control device includes a display, the display configured to give a visual indication of the power level of the glass removal tool.

4. The glass removal system of claim 1, the attachment mechanism comprising:
- a suction cup, an interior surface of the suction cup faces and is attached to the inner surface of the piece of glass; and
- a tube coupled to and extending between the vacuum pump and the suction cup;
- wherein, when the vacuum pump is turned on, air within the suction cup is evacuated creating a pressure differential between a space inside the suction cup and an outside environment such that the suction cup is attached to the piece of glass.

5. The glass removal system of claim 4, wherein the vacuum force generated by the vacuum pump is greater than the cutting force generated by the glass removal tool cutting the sealant.

6. The glass removal system of claim 1, further comprising a plurality of cutting medium retainers coupled to the inner surface of the piece of glass, each cutting medium retainer comprising:
- a suction cup for coupling to the piece of glass;
- a retainer to engage the cutting medium; and
- a body connected to the suction cup and the retainer.

7. The glass removal system of claim 6, wherein the plurality of cutting medium retainers are placed on the inner surface of the piece of glass in locations such that a linear relationship between the cutting force and an angle of the cutting medium is created, allowing the sealant to be removed after a single placement of the glass removal tool on the piece of glass.

8. The glass removal system of claim 7, wherein there are four cutting medium retainers with each one of the four cutting medium retainers positioned on the inner surface of the piece of glass in a corner of the piece of glass.

9. The glass removal system of claim 1, wherein an end of the cutting medium extended around the outer surface of the piece of glass is coupled to an anchor device.

10. The glass removal system of claim 1, wherein the battery is a rechargeable power tool battery.

11. The glass removal system of claim 1, wherein the body further comprises: a plurality of connectors extending between and couple the upper plate to the lower plate, wherein a gap is defined between the upper plate and the lower plate.

12. The glass removal system of claim 11, wherein the transmission system is positioned within the gap.

* * * * *